United States Patent [19]

Zook

[11] Patent Number: 5,592,404
[45] Date of Patent: Jan. 7, 1997

[54] VERSATILE ERROR CORRECTION SYSTEM

[75] Inventor: Christopher P. Zook, Longmont, Colo.

[73] Assignee: Cirrus Logic, Inc., Fremont, Calif.

[21] Appl. No.: 307,259

[22] Filed: Sep. 16, 1994

Related U.S. Application Data

[63] Continuation-in-part of Ser. No. 147,758, Nov. 4, 1993.

[51] Int. Cl.$^6$ ............................. G06F 7/00; G06F 15/00; H03M 13/00
[52] U.S. Cl. ........................ 364/746.1; 371/37.1
[58] Field of Search ................................ 371/37.1, 37.8, 371/38.1, 39.1; 364/746.1

[56] References Cited

U.S. PATENT DOCUMENTS

| Re. 28,923 | 8/1976 | Patel | 340/146.1 |
|---|---|---|---|
| 4,077,028 | 2/1988 | Lui et al. | 340/146.1 |
| 4,787,085 | 11/1988 | Suto et al. | 370/110.1 |
| 5,010,554 | 4/1991 | Bechtel et al. | 371/37.1 |
| 5,084,878 | 1/1992 | Kanekawa et al. | 371/36 |
| 5,185,711 | 2/1993 | Hattori | 364/746.1 |
| 5,218,691 | 6/1993 | Tuma et al. | 395/500 |
| 5,291,584 | 3/1994 | Challa et al. | 395/500 |
| 5,297,148 | 3/1994 | Harari et al. | 371/10.2 |
| 5,404,361 | 4/1995 | Casorso et al. | 371/40.1 |
| 5,440,570 | 8/1995 | Wei et al. | 371/37.1 |

FOREIGN PATENT DOCUMENTS

| 0137425 | 4/1985 | European Pat. Off. . |
|---|---|---|
| 0364172 | 4/1990 | European Pat. Off. . |

OTHER PUBLICATIONS

Patent Abstracts Of Japan, vol. 18, No. 564 (P-1819) 27 Oct. 1994 & JP,A,06 203487 (Fujtsu) 22 Jul. 1994, see abstract.
Patent Abstracts Of Japan, vol. 18, No. 370 (P-1768), 12 Jul. 1994 & JP,A,06 096531 (Pioneer) 8 Apr. 1994, see abstract.
Patent Abstracts Of Japan, vol. 16, No. 571 (P-1459) [5614], 11 Dec. 1992 & JP,A,04 222029 (Sony) 12 Aug. 1992, see abstract.

*Primary Examiner*—Paul P. Gordon
*Assistant Examiner*—Emmanuel L. Moise
*Attorney, Agent, or Firm*—Nixon & Vanderhye, P.C.

[57] ABSTRACT

An error correction system operates in two modes: (1) a two-phased mode for correcting computer data having pointers; and (2) a subcode mode for correcting subcode packs included with audio digital data. During a first (two-phased) mode for correcting computer data with pointers, a generator (20), calculator (30), and corrector (60) are each operated during two phases. During a first phase (PTR_TIME) the generator (20) generates one or two multi-bit buffer-obtained pointers ($\alpha^{L0}=P_0$, $\alpha^{L1}=P_1$) for the most-recent codeword while the calculator (30) uses syndromes ($S_0$, $S_1$) generated by generator (20) for a previous codeword $CW_{n-1}$ to generate one or two error patterns ($E_0$, $E_1$) for the previous codeword. During a second phase (DATA_TIME), the generator (20) generates syndromes ($S_0$, $S_1$) for the most-recent codeword $CW_n$ while the calculator (30) performs mathematical operation(s) with respect to any multi-bit buffer-obtained pointers (i.e., $P_0$, $P_1$) for the most-recent codeword $CW_n$. In a second mode for correcting subcodes, the system first generates differing sets of subcode syndromes with respect to differing portions of the pack. After generation of the subcode syndromes, the system controller (10) analyzes the subcode syndromes and applies differing correction strategies in accordance with the analysis.

73 Claims, 20 Drawing Sheets

| Bit | R | S | T | U | V | W |
|---|---|---|---|---|---|---|
| Symbol 0 | MODE ||| ITEM |||
| 1 | INSTRUCTION ||||||
| 2 | PARITY Q0 ||||||
| 3 | PARITY Q1 ||||||
| 4 | DATA field ||||||
| ⋮ | ||||||
| 19 | ||||||
| 20 | PARITY P0 ||||||
| 21 | PARITY P1 ||||||
| 22 | PARITY P2 ||||||
| 23 | PARITY P3 ||||||

*Fig. 8A*

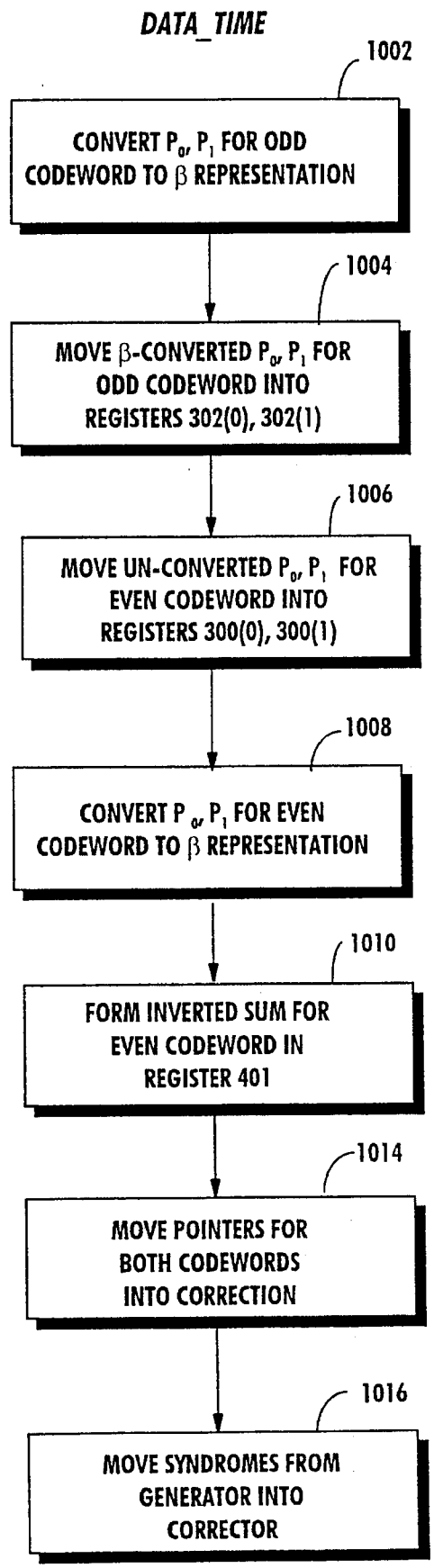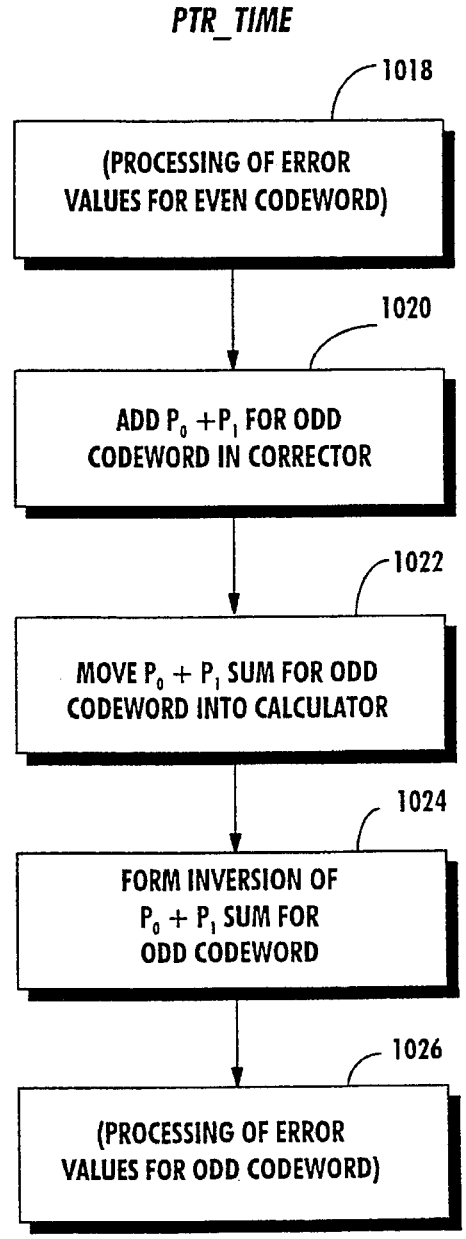
Fig. 10A
Fig. 10B

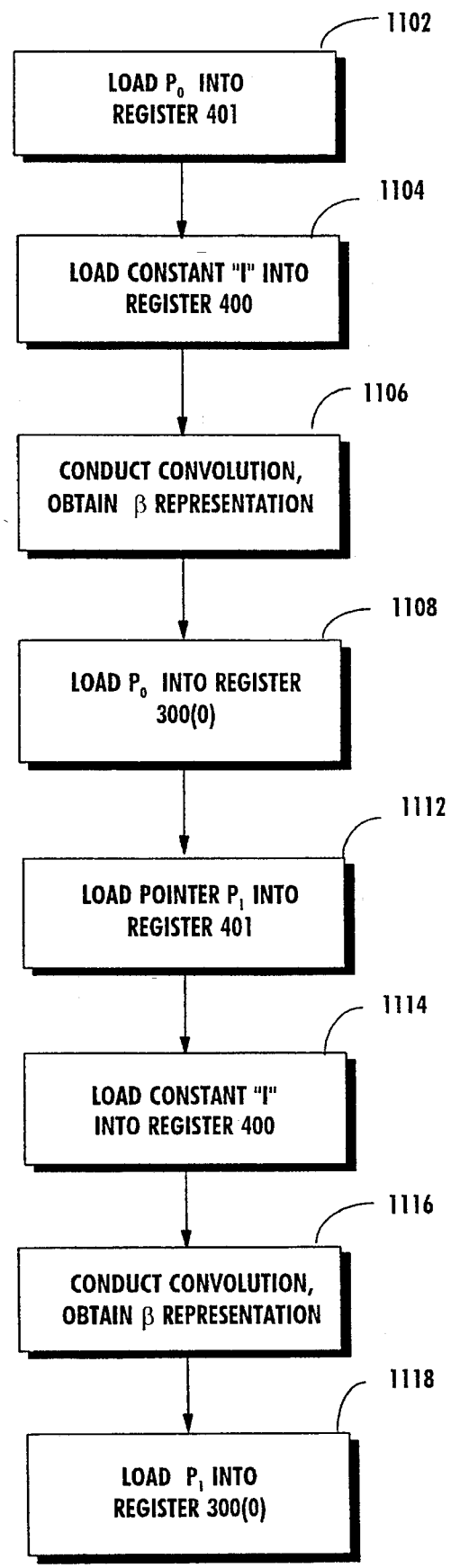

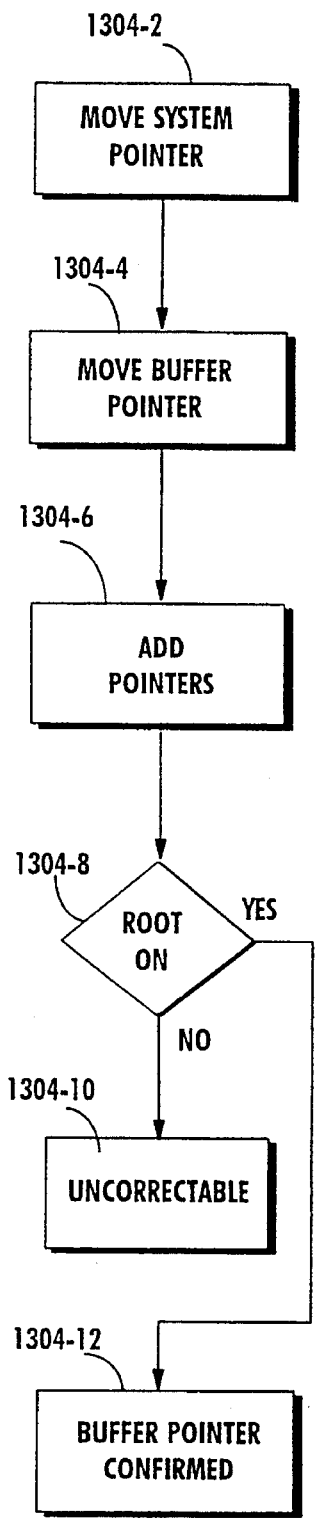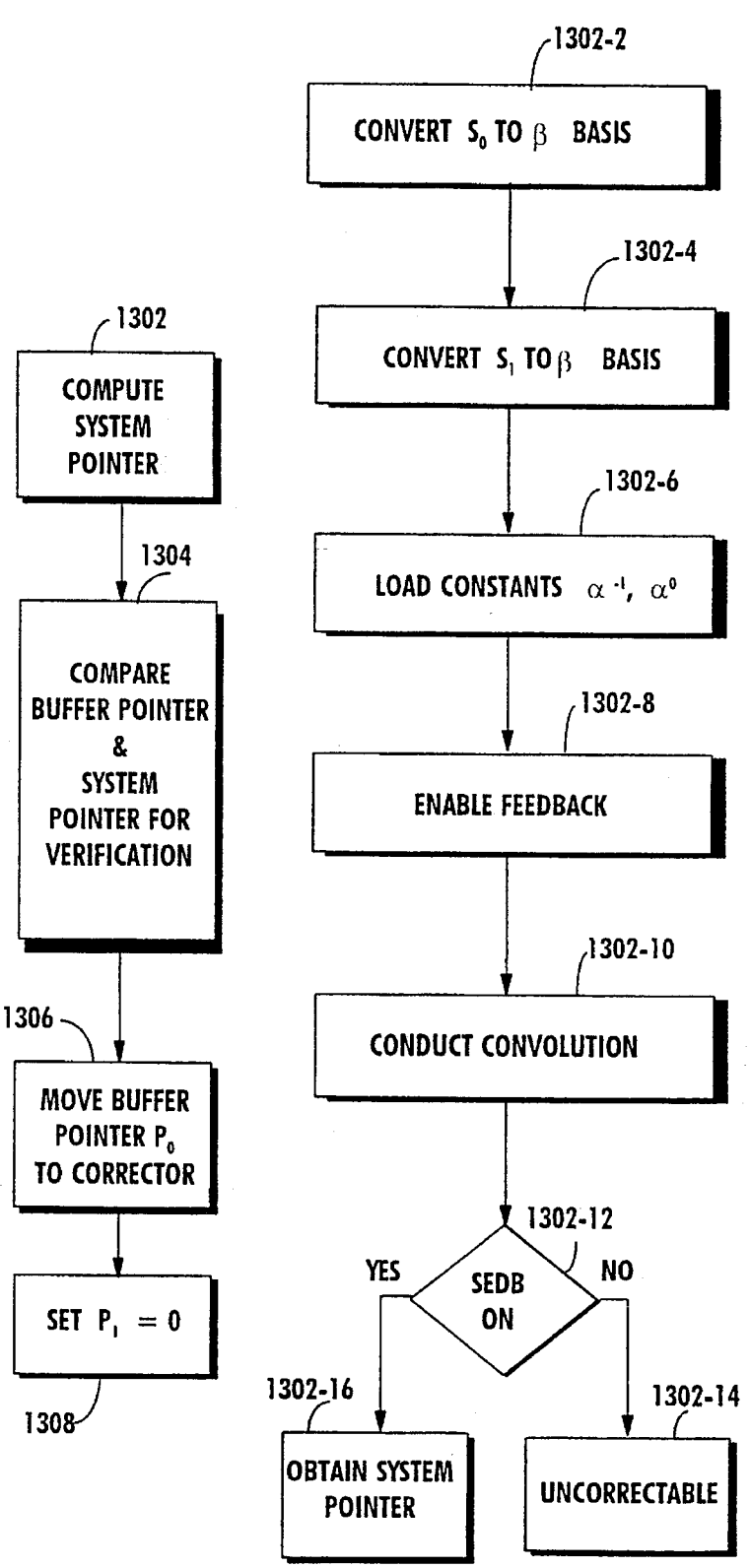
Fig. 13B    Fig. 13    Fig. 13A

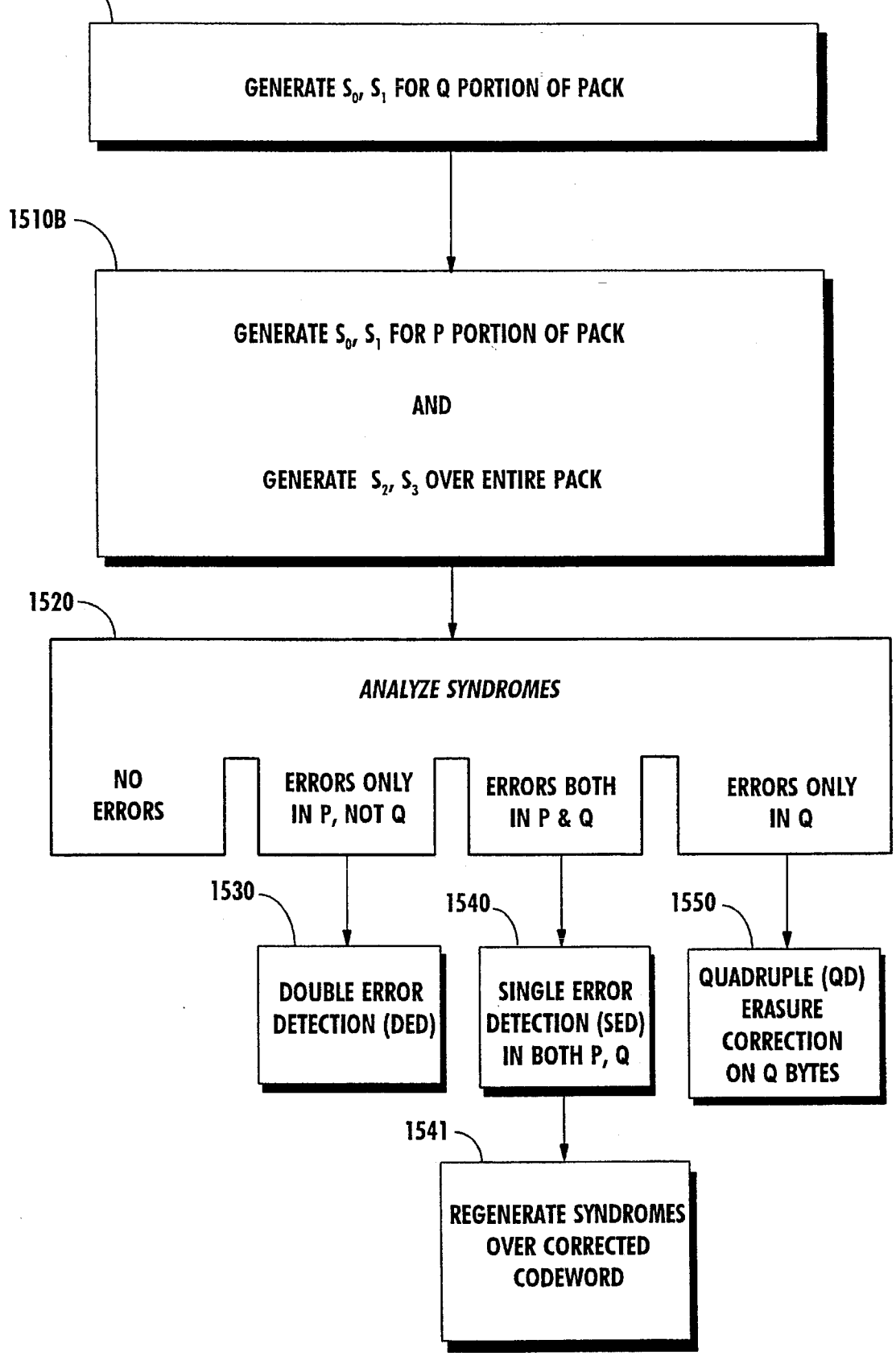

DED

SED OVER
BOTH PORTIONS
OF PACK

QUADRUPLE
ERROR CORRECTION
FOR SUBCODES

VERSATILE ERROR CORRECTION SYSTEM

This application is a continuation-in-part of U.S. patent application Ser. No. 08/147,758, filed by Chris Zook on Nov. 4, 1993 and entitled "FINITE FIELD INVERSION", and is related to the following simultaneously-filed patent applications: U.S. patent application Ser. No. 08/306,918, filed Sep. 16, 1994 by Chris Zook and entitled "MULTIPURPOSE ERROR CORRECTION CALCULATION CIRCUIT"; U.S. patent application Ser. No. 08/306,914, filed Sep. 16, 1994 by Chris Zook and entitled "CRC/EDC CHECKER SYSTEM"; all of the foregoing being incorporated herein by reference.

BACKGROUND

1. Field of Invention

This invention pertains to error correction systems, including but not limited to error correction systems for compact disk drives which can process either computer data or digital audio data.

2. Related Art and Other Considerations

Compact disks (CDs) were initially used for audio recording and reproduction. Manipulation of CDs by a CD drive for audio purposes does not involve random access, and any searching (e.g., for different audio works recorded on the disk) occurs at a relatively slow speed. Moreover, since the human ear processes and receives reproduced audio in a continuous, essentially real-time manner, for audio purposes it is not necessary for CD drives to correct all errors. If an uncorrectable error occurs in audio recording, it is not practical to back up and re-read the portion of the CD where the error resides in an attempt to correct the error. Instead, any uncorrectable error is typically blanked out and/or replaced with a signal deduced (e.g., averaged) with other time-proximate signals.

Recording on a CD occurs in an essentially spiral path, the path being conceptualized to some extent as having tracks of different radii. For audio use CDs are formatted to contain a plurality of frames. Each frame has 2352 8-bit bytes of digital audio data.

For audio use, CDs are formatted to contain not only digital audio data for the works (e.g., songs) recorded thereon, but also subcodes. The subcodes are dispersed amongst the audio data on the CD at regular intervals. The dispersed subcodes are assembled for grouping into packs. As shown in FIG. 8A, each subcode pack has 24 6-bit fields. Thus, the field length (6 bits) of each subcode field differs from the field length (8 bits) of the data bytes.

As shown in FIG. 8A, a subcode pack is conceptualized as being divided into a "Q" part and a "P" part. The "Q" part of each subcode pack consists of the first four 6-bit symbols (e.g., bytes 0–3); the "P" part of each subcode pack consists of the remaining symbols (bytes 4–23). Although not necessary for an understanding of the present invention, it is mentioned in passing that subcodes are utilized to provide such indications as when a track is switched, whether a track is audio data or not, the length of time since the beginning of the work, etc. In some applications, graphical information for visual display information for accompanying the audio output (e.g., karaote) can be stored in the subcodes.

Although initially used for audio purposes, in more recent years CDs have also been used for recording computer data. From the perspective of computer data, the CD is formatted to include a plurality of 2352 8-bit bytes. Subcodes are not utilized with computer data recorded on CD.

When a CD is being reproduced, pertinent portions of a frame (for audio) or sector (for computer data) are loaded into a buffer (e.g., RAM). The buffer holds 2064 bytes of data for each frame/sector.

All CD data is protected at the lowest level by the CIRC ECC. In connection with recording/reproducing computer data, some CD systems provide additional error correction capability called layered ECC. For purposes of performing error correction, as stored in the buffer each frame/sector is conceptualized as comprising two blocks or interleaves. FIG. 8B shows both an even block/interleave and an odd block/interleave for a frame/sector. The two blocks of a frame/sector are operated upon by error correction codes using a scheme of product codes. In each block, a column of bytes comprises a codeword. For example, in the even block, bytes 0000, 0043, 0086, . . . , 0989 comprise a data portion of column codeword $CWeven_0$; bytes 0001, 0044, 0087, . . . , 0990 comprise a data portion of column codeword $CWeven_1$; and so forth. Bytes 1032 and 1075 comprise an ECC portion of column codeword $CWeven_0$; bytes 1033 and 1076 comprise an ECC portion of column codeword $CWeven_1$; and so forth. Similar codewords $CWodd_0$, $CWodd_1$, etc., exists for the odd block. Thus, there are forty-three column codewords for each block. The last two bytes of each block (e.g., bytes $1030_{even}$; $1030_{odd}$; $1031_{even}$; $1031_{odd}$) contain CRC/EDC information and accordingly are known as EDC or CRC bytes. In some formats the CRC bytes are not necessarily the last bytes of the data portion of a block. For example, data formats which do not completely fill the blocks of FIG. 2 can place the CRC bytes following the end of data and follow the CRC bytes with pad bytes of zeros until the blocks are filled.

Also in each block, a diagonal line of bytes comprises a diagonal codeword. For example, with reference to the even block of FIG. 8B, a first diagonal codeword includes bytes 0000, 0044, 0088, . . . 1056, 1100, 0026, . . . 0686, 0730, 1118, 1144. Thus, there are forty-two column codewords and twenty-six diagonal codewords for each block.

The illustration of FIG. 8B should not obscure the fact that the data in the buffer is not stored in codeword order. For example, a sector in the buffer has bytes stored in the following order: byte 0000 of the even block (i.e., byte $0000_{even}$); byte 0000 from the odd block (i.e., byte $0000_{odd}$); byte $0001_{even}$; byte $0001_{odd}$; and so forth continuing to byte $1031_{even}$, $1031_{odd}$.

When computer data has been received from a CD by a system having error correction capability, the CIRC ECC may generate error pointers to be used by the layered ECC. In such error correction systems for CD drives, up to two pointers are supplied for each codeword. Each pointer is usually one bit of information. Typically pointer information for a sector is stored in the buffer either before or after its associated sector, and in such a manner that it can be determined to which byte of which codeword the pointer refers.

Thus, for computer data purposes, the buffer for the CD system has stored a plurality of sectors, with pointer information also being stored therein for each sector. Similarly, for audio purposes, the buffer of the CD system has stored therein a plurality of frames, as well as a plurality of packs of subcodes.

SUMMARY

An error correction system operates in two modes: (1) a two-phased mode for correcting computer data having pointers; and (2) a subcode mode for correcting subcode packs included with audio digital data. During the two-phased mode for correcting computer data with pointers, a generator, calculator, and corrector are each operated during two phases. During a first phase (known as PTR_TIME):

(a) the generator uses any one bit buffer-obtained pointer for a most-recent codeword $CW_n$ to generate one or two multi-bit buffer-obtained pointers ($\alpha^{L0}=P_0$, $\alpha^{L1}=P_1$) for the most-recent codeword;

(b) the calculator uses syndromes ($S_0$, $S_1$) generated by the generator for a previous codeword $CW_{n-1}$ to generate one or two error patterns ($E_0$, $E_1$) for the previous codeword; and (c) the correction section holds pointer values ($\alpha^{L0}=P_0$, $\alpha^{L1}=P_1$) for a previous codeword $CW_{n-1}$ for the calculation unit.

During a second phase (shown as DATA_TIME):

(a) the generator generates syndromes ($S_0$, $S_1$) for the most-recent codeword $CW_n$;

(b) the calculator performs mathematical operations with respect to any multi-bit buffer-obtained pointers (i.e., $P_0$, $P_1$) provided for the most-recent codeword $CW_n$; and (c) the correction unit corrects the previous codeword $CW_{n-1}$.

In each of the two phases, the generation section, the calculation section, and the correction section wait upon the last-to-finish section before the entire system can proceed to the next phase.

The present system thus differs from conventional pipelining techniques which require three simultaneous stages/operations, each stage/operation using different inputs and in general passing inputs from one stage to the next. The constituent sections of the present system each handle two different operations in a time division manner. Moreover, each section performs two functions, depending on the phase of operation. At the end of a phase of operation, each section passes information to another section, but does not then repeat the same operation in the next phase. Rather, during the following phase, each section performs a different operation, as summarized above and described in more detail below.

In the subcode mode, the error correction system attempts to perform correction with a subcode pack. In correcting subcodes, the system first generates syndromes with respect to the pack, in particular syndromes $S_0$ and $S_1$ over a first or "Q" portion of the pack; syndromes $S_0$ and $S_1$ over a second or "P" portion of the pack; and syndromes $S_2$ and $S_3$ over the entire pack. After generation of the syndromes, the system controller analyzes the syndromes and applies differing correction strategies in accordance with the analysis. According to a first case wherein errors occur in the P portion of the pack but not in the Q portion of the pack, a double error detection strategy [DED] is executed. According to a second case wherein errors occur in both the P and Q portions of the pack, a single error detection strategy [SED] is executed with respect to both portions of the pack and the syndromes subsequently regenerated over the corrected codeword as a further check. According to a third case wherein errors occur in the Q portion of the pack but not in the P portion of the pack, a quadruple error detection strategy [QD] is executed.

In view of the differing field lengths of the computer data and the subcodes, advantageously the syndrome generator is selectively configurable for selection of differing feedback paths (e.g., feedback multipliers).

BRIEF DESCRIPTION OF THE DRAWINGS

The foregoing and other objects, features, and advantages of the invention will be apparent from the following more particular description of preferred embodiments as illustrated in the accompanying drawings in which reference characters refer to the same parts throughout the various views. The drawings are not necessarily to scale, emphasis instead being placed upon illustrating the principles of the invention.

FIG. 8A illustrates a format of a conventional subcode pack.

FIG. 10 is a flowchart generally depicted steps involved with a processing of pointers.

FIG. 11 is a flowchart illustrating steps executed by a calculation circuit of the invention in converting a value from $\alpha$ basis representation to $\beta$ basis representation.

FIG. 13 is a flowchart illustrating basic steps involved in a first case of error pattern generation.

FIG. 15 is a flowchart depicting steps executed by the CD ROM error correction system of FIG. 1 when processing subcodes, and further shows a relationship between FIG. 15 and FIG. 15A, FIG. 15B, and FIG. 15C.

DETAILED DESCRIPTION OF THE DRAWINGS

Figure 1:
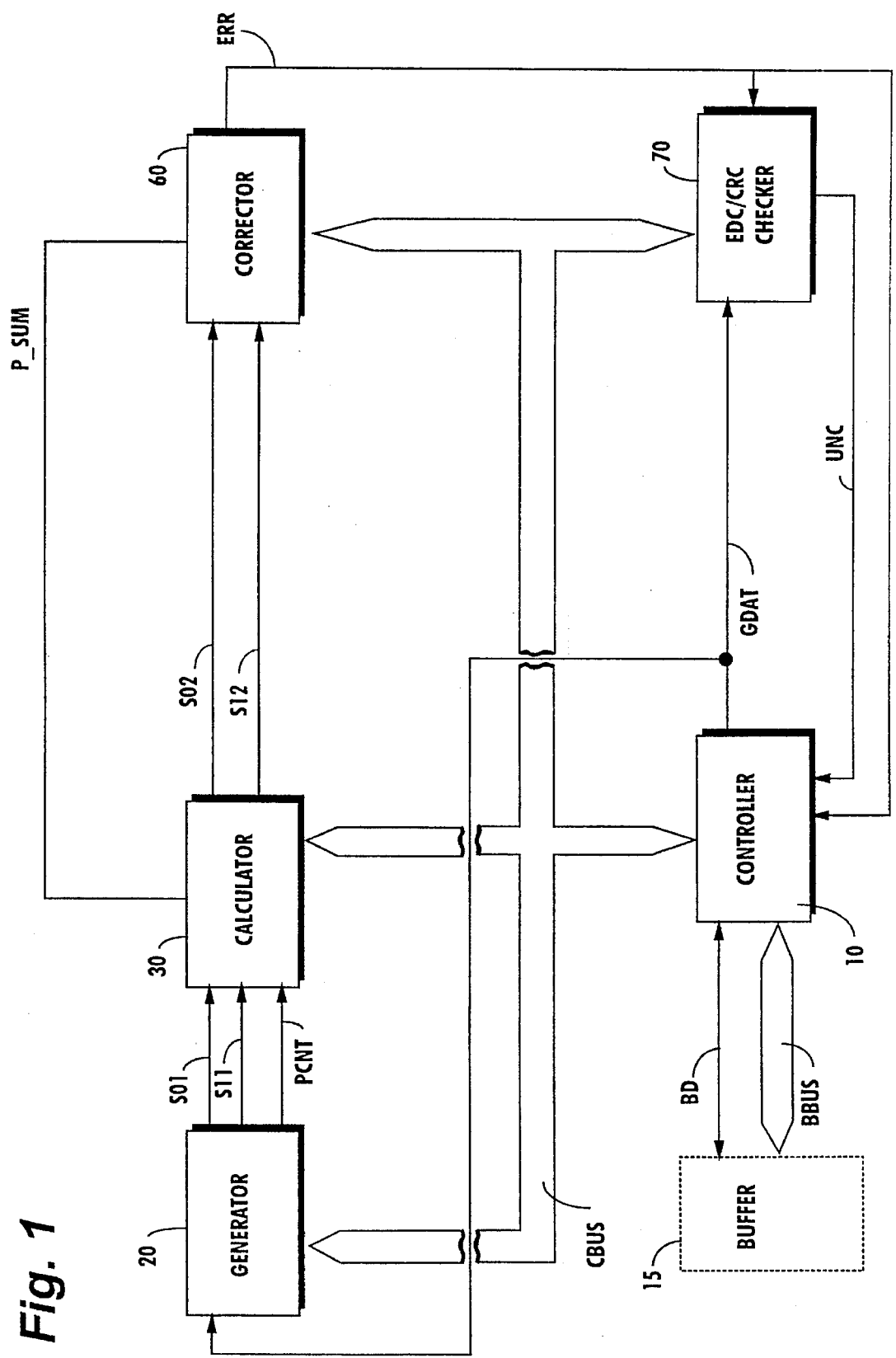
FIG. 1 is a schematic block diagram of a CD ROM error correction system according to an embodiment of the invention.
Figure 8B:
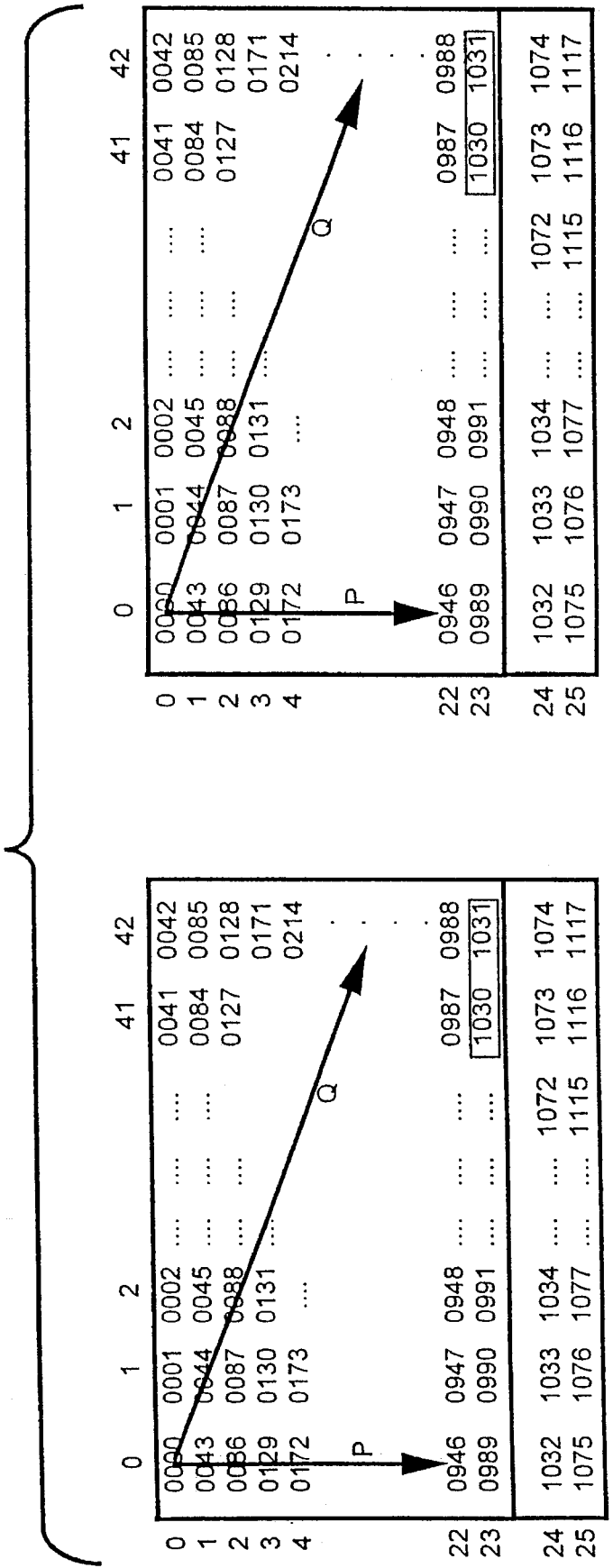
FIG. 8B illustrates a two-blocked, interleaved conceptualization of codewords stored in a buffer.

FIG. 1 shows a CD ROM error correction system which communicates via a system controller 10 with a buffer (depicted generally by phantom line 15). The buffer has stored therein a plurality of either sectors or frames, in accordance with whether the CD ROM system is currently operating to process computer data or digital audio data. When processing computer data, the buffer also has stored therein pointer bits as described above. When processing digital audio data, the buffer has subcodes dispersed therein which yield the subcode pack as illustrated in FIG. 8A and discussed above. An interleaving technique is implemented in the particular error correction scheme illustrated herein, so that a sector of data is conceptualized as including two blocks of codewords, e.g., an even block and an odd block, as depicted in FIG. 8B. Bytes of data are transferred between the buffer and controller 10 via data bus BD, with other information including control information being exchanged on control bus BBUS.

The CD ROM error correction system of FIG. 1 further includes a generator or generation section 20; a calculator or calculation section 30; a corrector or correction section 60; and an EDC checker section 70. All activity of the CD ROM error correction system of FIG. 1 is supervised by controller 10, e.g., using control and other signals carried on bus CBUS. These control and other signals are illustrated in other figures which are more specific to the constituent sections of the system.

STRUCTURE

GENERATOR

Figure 2:
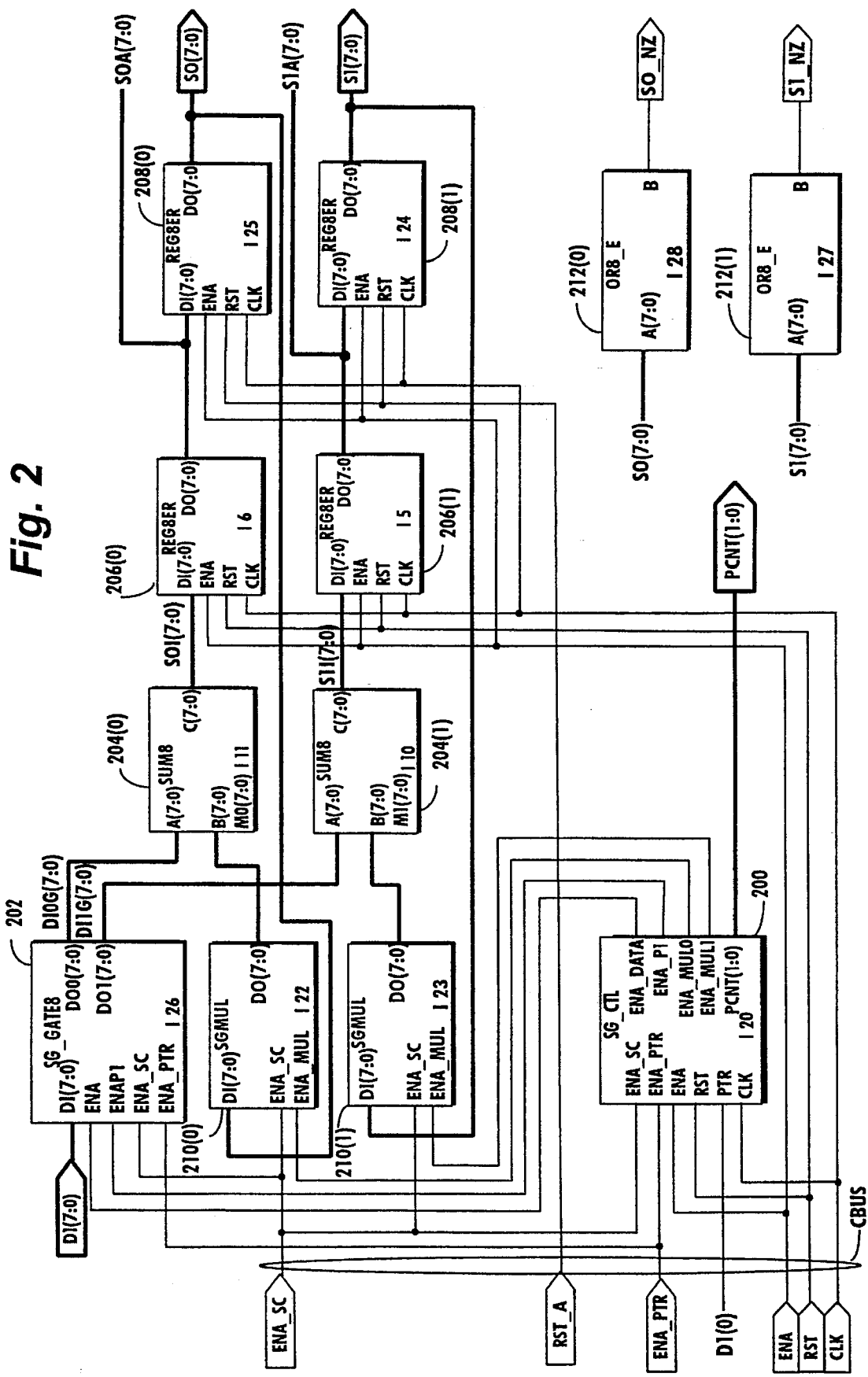
FIG. 2 is a schematic block diagram of a generator section for the CD ROM error correction system of FIG. 1.

Generator 20, also known as SYNGEN, is illustrated in more detail in FIG. 2. As will be seen hereinafter, during a computer data/pointer mode generator 20 generates syndromes for codewords during a DATA_TIME phase and generates m-bit error pointer values during a PTR_TIME phase. During a subcode mode, generator 20 generates syndromes for subcodes.

Generator 20 has its own section controller, or generator controller 200, which basically operates under supervision of system controller 10 to which it is connected by leads included in CBUS. Generator 20 further includes a gate chip 202; two adders 204, particularly adders 204(0) and 204(1); two immediate registers 206, particularly registers 206(0) and 206(1); two ultimate registers 208, particularly registers 208(0) and 208(1); and two versatile feedback circuits 210, particularly feedback circuits 210(0) and 210(1). In addition, generator 20 includes two OR gates 212, particularly OR gates 212(0) and 212(1).

Data from the buffer is transmitted from system controller 10 to generator 20 on parallel bus GDAT, and is applied to gate 202 at pin DI thereof. In view of the interleaved operation of the illustrated system, two bytes of data are consecutively applied to generator 20 during each transmission. In particular, for each transmission a byte of data from the even interleave is first applied to gate 202 and is followed by a byte of data from the odd interleave. As illustrated in FIG. 2, generator 20 actually comprises two sub-generators, an $S_0$ syndrome sub-generator comprising adder 204(0), register 206(0), register 208(0), and feedback circuit 210(0); and an $S_1$ syndrome sub-generator comprising adder 204(1), register 206(1), register 208(1), and feedback circuit 210(1). During a computer data/pointer mode, for example, gate 202 directs bytes from the even interleave to the even sub-generator and bytes from the odd interleave to the odd sub-generator.

Figure 2A:
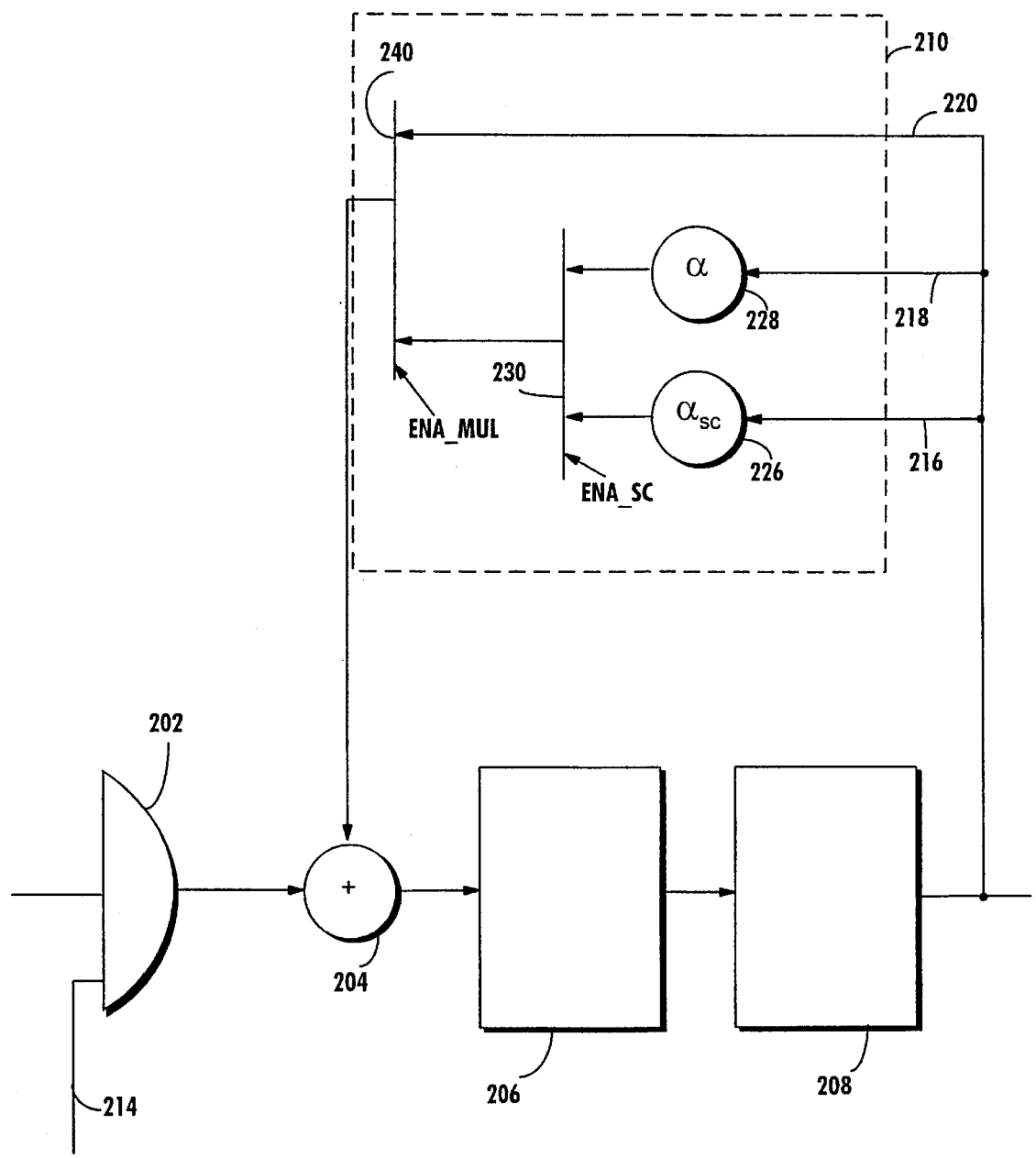
FIG. 2A is a schematic block diagram showing a circuit implementation of a portion of the generator circuit of FIG. 2.

Each sub-generator is alternately represented in a functional manner in FIG. 2A. A signal applied on enable line 214 allows gate 202 to apply a byte into adder 204. The applied byte is added with a signal gated through feedback circuit 210. The addition result is first stored in immediate register 206, and then shifted into ultimate register 208. Thus, the contents of the ultimate register 208 can be feedback via feedback circuit 210 to adder 204.

FIG. 2A illustrates the selective configurability of generator 20, and feedback circuit 210 in particular. For example, feedback circuit 210 is shown as including three alternate feedback lines, namely feedback lines 216, 218, and 220. Feedback lines 216 and 218 have multipliers 226 and 228 provided thereon, whereas feedback line 220 has no multiplier. Multiplier 226 multiplies by a feedback value illustratively depicted as $alpha_{sc}$ (used when subcodes are being processed); multiplier 228 multiplies by a feedback value illustratively depicted as alpha (used when subcodes are not being processed). Output terminals of multipliers 226 and 228 are connected to respective alternate input terminals of a multiplier selection switch (multiplexer) 230. An output terminal of multiplier selection switch 230 is connected to a first input terminal of a multiplication enable switch (multiplier) 240, a second input terminal of switch 240 being connected to feedback line 220. When a value stored in ultimate register 208 is to be multiplied by a feedback multiplier, a signal ENA_MUL applied to switch 240 gates therethrough either the feedback signal (multiplied by multiplier 226) on line 216, or the feedback signal (multiplied by multiplier 228) on line 218, in accordance with the signal ENA_SC applied to switch 230.

As will be seen subsequently, when generator 20 is used (during a DATA_TIME phase of operation) to generate syndromes, register 208(0) is used to store a first syndrome (S0) generated for a codeword from the even interleave; register 206(0) is used to store a first syndrome (S0) generated for a codeword from the odd interleave; register 208(1) is used to store a second syndrome (S1) for the codeword from the even interleave; and, register 206(1) is used to store a second syndrome (S1) for the codeword from the odd interleave. When generator 20 is used (during a PTR_TIME phase of operation) to generate pointers, a first pointer for an even interleave codeword may be stored in register 208(0); a second pointer for an even interleave codeword may be stored in register 208(1); a first pointer for an odd interleave codeword may be stored in register 206(0); and, a second pointer for an odd interleave codeword may be stored in register 206(1). When generator 20 is used to generate syndromes for subcodes, subcode syndromes S0, S1, S2, and S3 are stored in registers 208(0), 208(1), 206(0), and 206(1), respectively.

Values stored in generator registers 208(0) and 208(1) are transferable to calculation section 30. Transfers from registers 208(0) and 208(1) occur on buses S0, S1, respectively [as shown in FIG. 2], also labeled as buses S01, S11, respectively [as shown in FIG. 1].

STRUCTURE

CALCULATOR

Figure 3A:
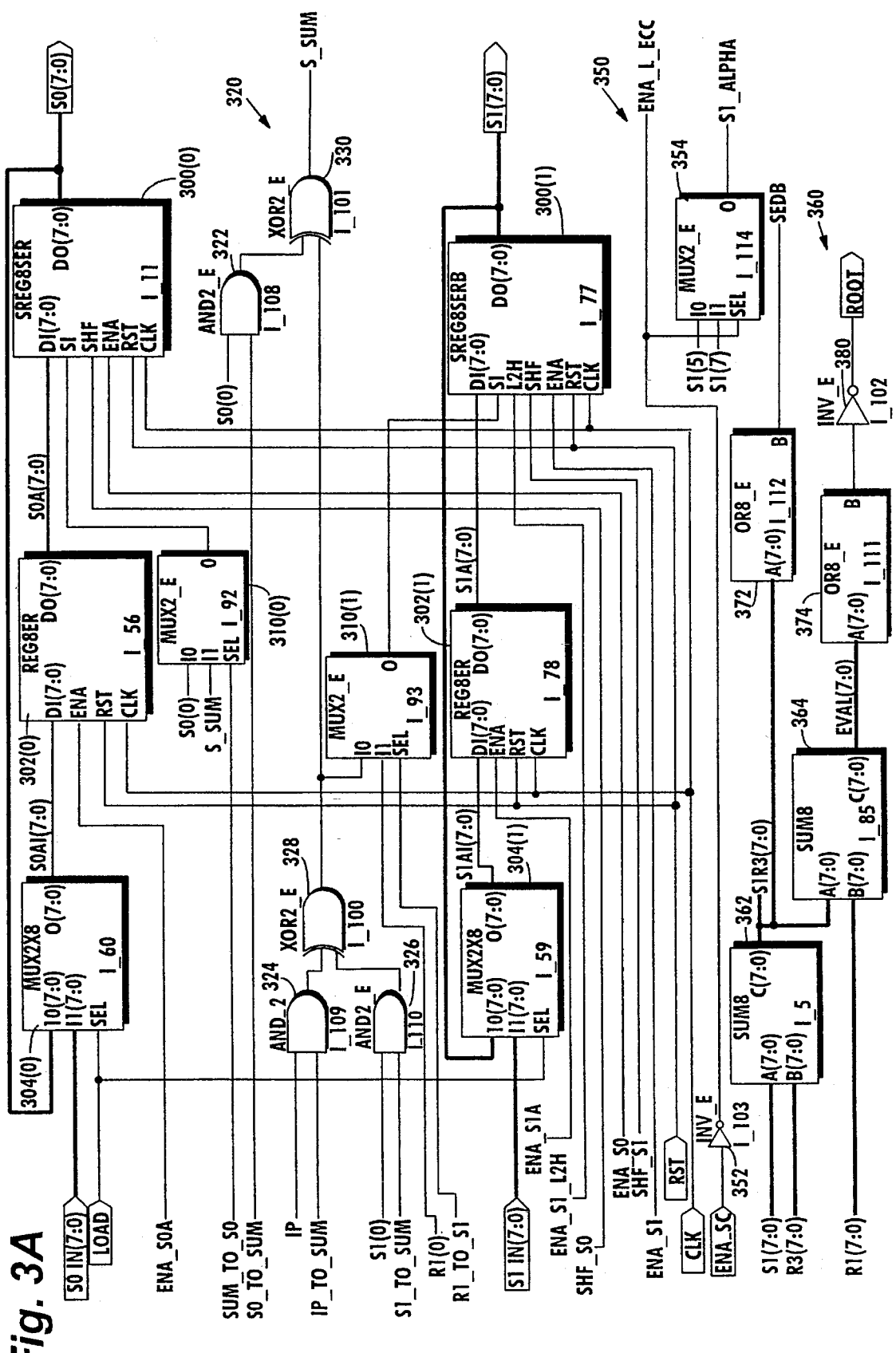
FIG. 3 is a schematic block diagram showing a relationship between FIG. 3A and FIG. 3B, FIG. 3A and FIG. 3B being schematic block diagrams collectively illustrating a calculation section for the CD ROM error correction system of FIG. 1.
Figure 3B:
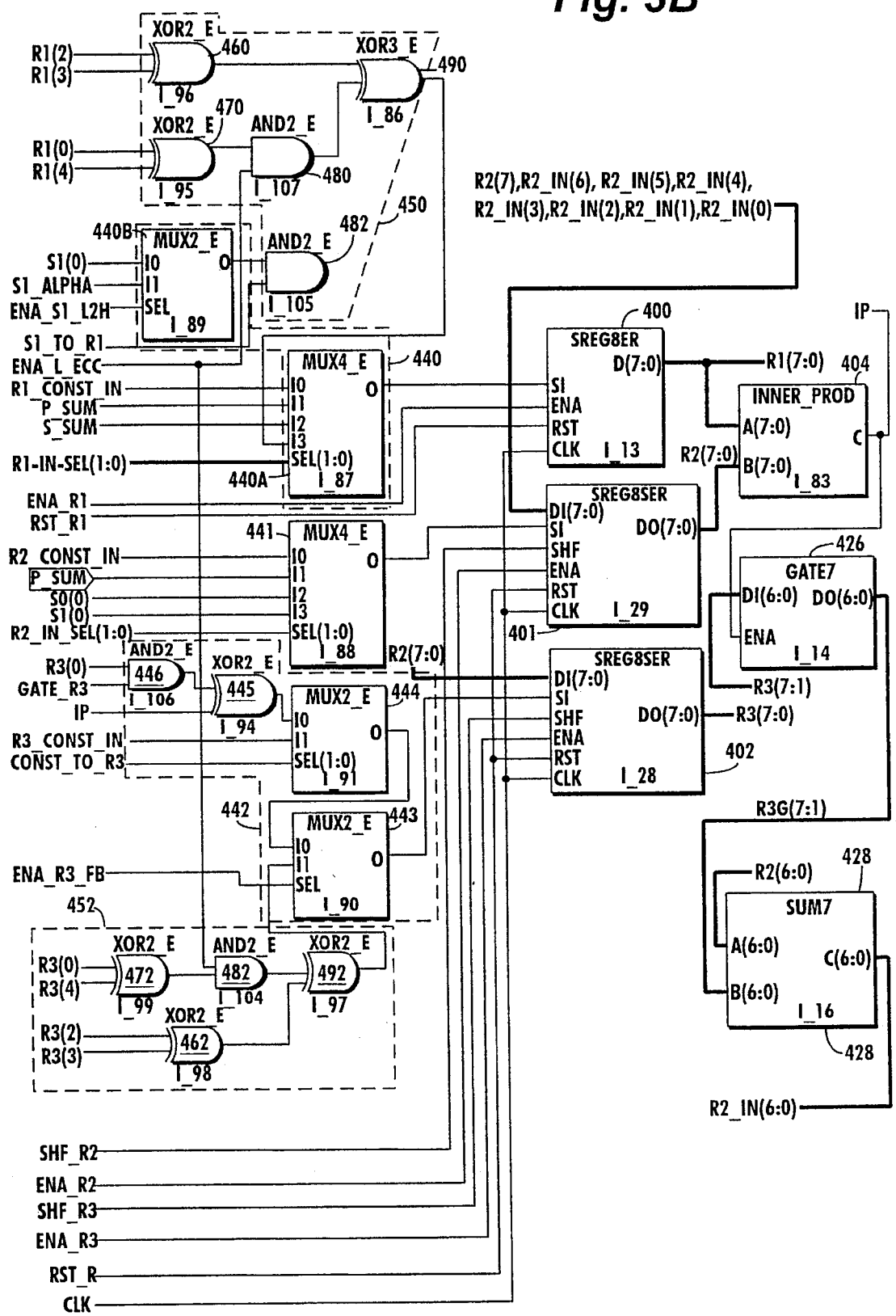

Calculator 30 includes both a pre/post-processing sub-section (illustrated in FIG. 3A) and an execution sub-section (illustrated in FIG. 3B). Taken together, the pre/post-processing sub-section and the execution sub-section form a multipurpose computational circuit which performs numerous serial operations, including addition, multiplication, inversion, basis conversion, and inner product formation.

A pre-processing sub-section of calculator 30 is shown in the top half of FIG. 3A, while a post-processing sub-section is shown in the bottom half of FIG. 3A. Pre-processing sub-section includes two multibit storage registers 300, particularly first multibit storage register 300(0) and second multibit storage register 300(1). Associated with each storage register 300 is an intermediate storage register 302, i.e., storage register 300(0) is connected to receive input from intermediate register 302(0); storage register 300(1) is connected to receive input from intermediate register 302(1). Entry of data into each intermediate register 302 is controlled by a switch (e.g., multiplexer) 304. Multiplexer 304(0) is used to select either output from register 208(0) [applied on a bus illustrated as S0 in FIG. 3A and as S01 in FIG. 1] or from the output terminal of register 300(0). Similarly, multiplexer 304(1) is used to select either output from register 208(1) [applied on a bus illustrated as S1 in FIG. 3A and as S11 in FIG. 1] or from the output terminal of register 300(1). Transfer of data from generator 20 into calculator 30, and through the multiplexers 304, intermediate registers 302, and to the storage registers 300 occurs in parallel.

Figure 5:
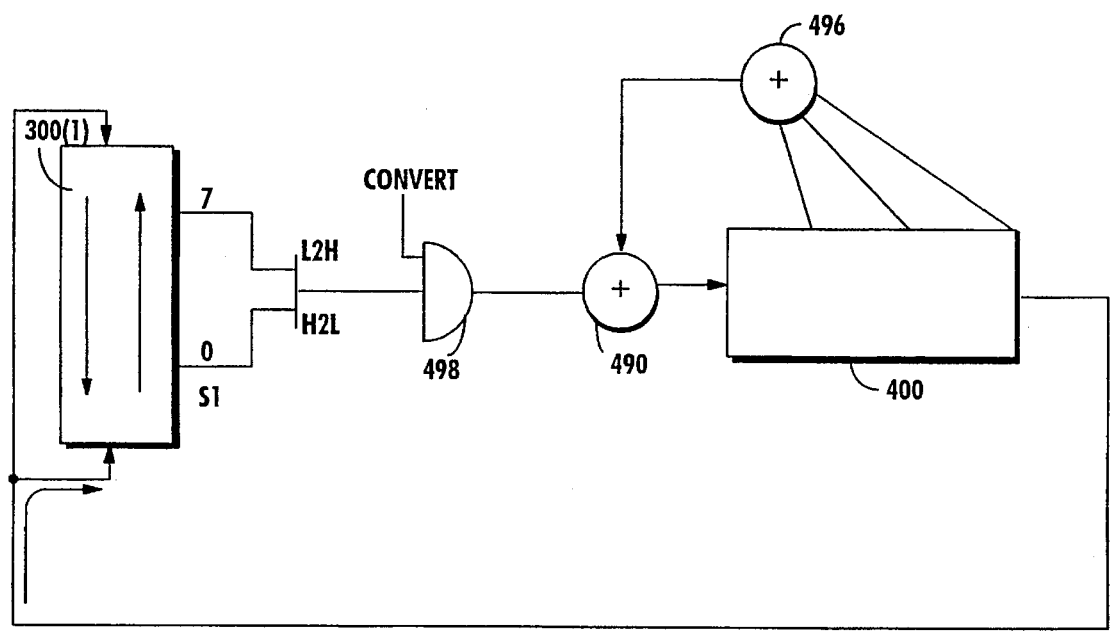
FIG. 5 is a schematic diagram of a basis conversion circuit included in the calculation section of FIG. 3A and FIG. 3B.

Storage registers 300(0) and 300(1) and the second multibit storage register are 8 bit serial shift registers. Storage register 300(1), which plays a particularly unique role in basis conversion operations as hereinafter discussed with respect to FIG. 5, is a bidirectional shift register. Values in registers 300 can either be read out in parallel for application to their respective multiplexers 304, or serially shifted out to the execution sub-section of FIG. 3B in the manner hereinafter described.

The pre-processing sub-section of calculator 30 further includes, as illustrated in FIG. 3A, register-feeding switches or multiplexers 310(0) and 310(1), which permit serial feeding of alternate value to registers 300(0) and 300(1), respectively (e.g., values other than those from the intermediate registers 302).

In addition, pre-processing sub-section of calculator 30 includes a summation circuit 320. Summation circuit includes a plurality of AND gates and XOR gates, notably AND gates 322, 324, and 326 and XOR gates 328 and 330. When AND gate 322 receives a control signal SO_TO_SUM, gate 322 serially passes the bits from register 300(0) to a first terminal of XOR gate 330. In accordance with corresponding control signals, either an inner product value IP (explained in execution sub-section of FIG. 3B) or the serially-applied contents of register 300(1) is applied to a second terminal of XOR gate 330. XOR gate 330 adds the two values applied thereto to produce a serial sum S_SUM. In this regard, the serial value IP and its associated control signal (IP_TO_SUM) are applied to AND gate 324 while the serial value from register 300(1) and its associated control signal (S1_TO_SUM) are applied to AND gate 326. Any values passed by AND gates 324 (the IP value), 326 (the contents of register 300(1)) are applied via XOR gate 328 for addition purposes to XOR gate 320, for production of the serial sum S_SUM.

As mentioned above, register 300(0) is potentially fed by values serially applied to register-feeding multiplexer 310(0). In particular, the two feeding values are the contents of register 300(0) itself (S0(0)) and the serial sum S_SUM just described. Similarly, register 300(1) is potentially fed by values serially applied to register-feeding mulitiplexer 310(1). The two feeding values for register 300(1) include the output of XOR gate 328 (which can be either the serial value IP or the serial contents of register 300(1) itself) or the serially-outputted contents of a register R1 (subsequently explained in execution sub-section of FIG. 3B).

The pre-processing sub-section of calculator 30 also includes a subcode accommodation portion 350. Subcode portion 350 includes an inverter 352 which inverts a subcode indicative signal (i.e., ENA_SUB) ultimately received from system controller 10 to yield a signal ENA_L_ECC which is applied to the execution sub-section of calculator 30. Subcode portion 350 further includes a length-select switch or multiplexer 354 which serially gates onto output line S1_ALPHA bit 5 from register 300(1) when a subcode is being processed and bit 7 from register 300(1) otherwise. The output line S1_ALPHA is applied to the execution sub-section of calculator 30 as hereinafter discussed.

The post-processing sub-section of calculator 30 includes a comparison circuit 360. Comparison circuit 360, which operates with parallel signal transfer, includes two eight bit summers, particularly summers 362 and 364; OR gates 372 and 374; and an inverter 380. Summer 362 adds the contents of register 300(1) and a value from the execution circuit of FIG. 3B (particularly a value from a third bank of registers). Summer 364 adds the output of summer 362 to another value from the execution circuit of FIG. 3B (particularly a value from a first bank of registers). The output terminal of summer 362 is connected to OR gate 372, such that OR gate 372 outputs (as signal SEDB) indicative of whether the two input values to summer 362 are equal. Similarly, the output terminal of summer 364 is connected to OR gate 374, which outputs an inverted signal ROOT when the two input values to summer 364 are equal.

Figure 4:
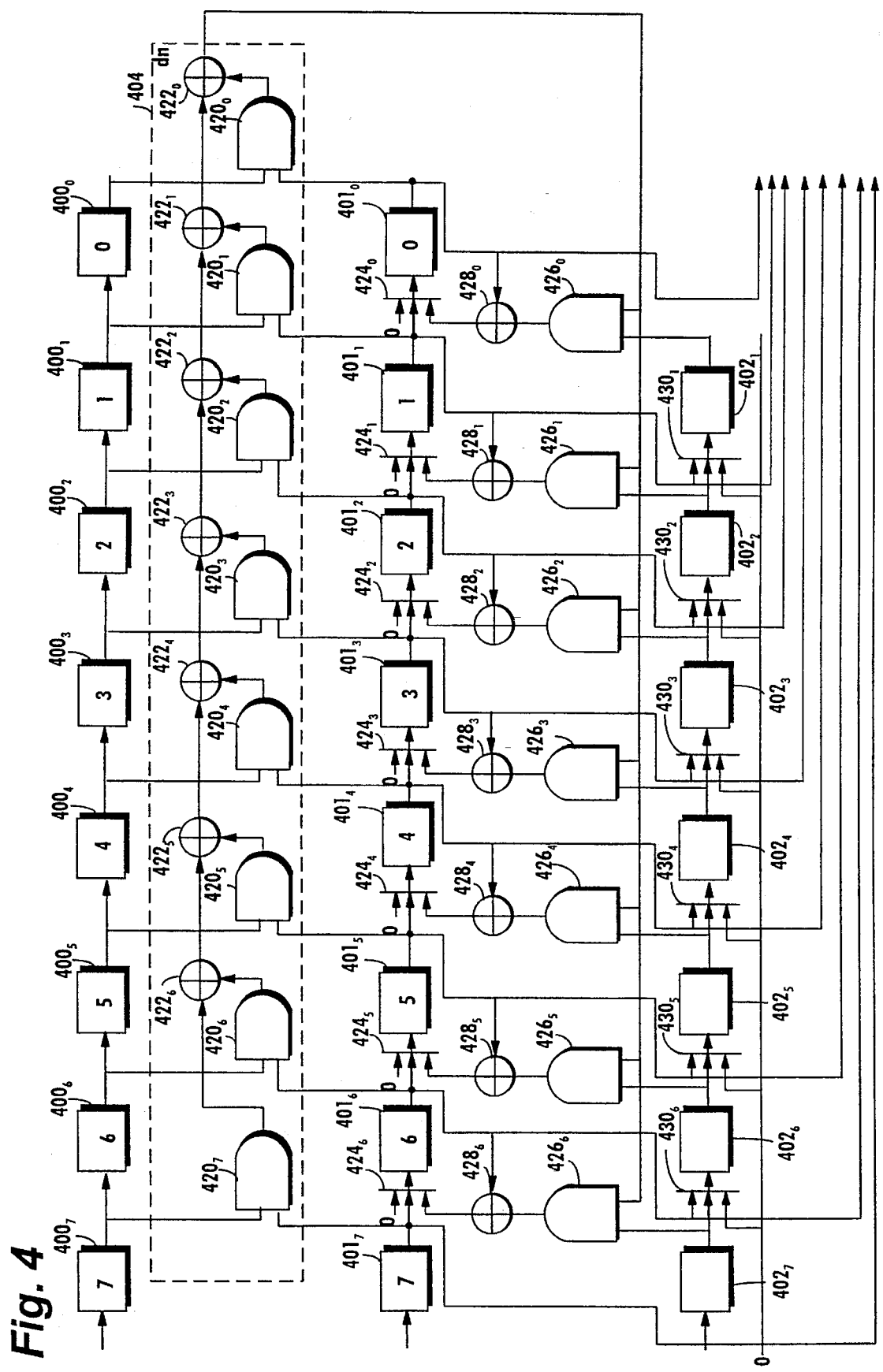
FIG. 4 is a schematic diagram of a convolution circuit included in the calculation section of FIG. 3B.

The execution sub-section of calculator 30 is illustrated generally in FIG. 3S, with portions thereof illustrated in more detail in FIG. 4. FIG. 3B shows a first serial register 400; a second serial register 401; and a third serial register 402. FIG. 3B also shows an inner product circuit 404; a gate circuit 426; and an adder circuit 428. Taken together, registers 400, 401, 402, inner product circuit 404, gate circuit 426, and adder circuit 428 constitute a convolution circuit of the Berlekamp-Massey type, but is bit oriented rather than byte oriented. In particular, inner product circuit 400 generates a serial inner product value (IP) with respect to the contents of the first register 400 and the contents of the second registers 401. Adder circuit 428 updates the contents of the second register 401, e.g. using the inner product generated by the inner product circuit 404 and the contents of the third register 401.

Details of the convolution circuit of FIG. 3B are understood both with reference to FIG. 4 and U.S. patent application Ser. No. 08/147,758 of Zook, filed Nov. 4, 1993, entitled "FINITE FIELD INVERTER" and incorporated by reference herein. For example, FIG. 3B shows that first register 400 is a bank of registers $400_0$–$400_7$; second register 401 is a bank of registers $401_0$–$401_7$; third register 402 is a bank of registers $402_0$–$402_7$. As used herein, the term "bank of registers" refers to any storage device through which bits may be serially shifted and utilized in a convolution operation.

FIG. 4 shows details of a bit-oriented convolution circuit which includes a bank of first registers $400_0$–$400_7$; a bank of second registers $401_0$–$401_7$; and a bank of third or intermediate registers $402_1$–$402_7$. In view of the binary orientation of circuit of FIG. 4, registers 400, 401, and 402 are each (one bit) flip-flops and, accordingly, are also referenced herein as flip-flops. Output pins of flip-flops 400 are connected so that the contents thereof can be rightwardly shifted (e.g., output from flip-flop $400_7$ to flip-flop $400_6$, output from flip-flop $400_6$ to flip-flop $400_5$, and so forth). In similar manner with a conventional Berlekamp-Massey circuit, output pins of paired ones (same number subscript) of the flip-flops 400 and 401 are ANDed together (at AND gates 420). Outputs from the output pins of AND gates 420 are added together by adders $422_0$–$422_6$ (which in GF(2) are XOR gates) to produce a term which is analogous to the current discrepancy $d_n$ (output from adder $422_0$).

The convolution circuit of FIG. 4 further includes a plurality of AND gates $426_0$–$426_6$, with each AND gate 426 having its output pin connected to a first input of an associated ADDER 428 (e.g., the output pin of AND gate $426_0$ is connected to the first input pin of ADDER $428_0$, the output pin of AND gate $426_1$ is connected to the first input pin of ADDER $428_1$, and so forth). A second input pin of each AND gate 426 is connected to receive the current discrepancy $d_n$ (i.e., inner product value IP) from ADDER $422_0$. A second input pin of each ADDER 428 is connected to the output pin of its corresponding (like subscripted) flip-flop 401. The output pin of each ADDER 428 is connected to the third input pin of a corresponding (like subscripted) three-input MUX 424 as described above. The second input pin of each AND gate 426 is connected to an output pin of a leftwardly neighboring intermediate flip-flop 402.

A three-input MUX 430 is provided for each intermediate flip-flop 402. MUXes $430_1$–$430_6$ have a first input pin connected to receive the initializing value "0"; MUX $430_7$ has a first and second input pins connected to receive the initializing values "1" and "0", respectively. A second input pin of MUXes $430_1$–$430_6$ is connected to receive the output from a leftwardly neighboring intermediate register 402 (a register 402 with subscript decremented by one). A third input pin of MUXes $430_1$–$430_7$ is connected to receive the output from a like-subscripted A flip-flop 401.

Each A flip-flop 401 has its output pin connected to a rightwardly neighboring flip-flop 401 (via the second input pin of a suitable MUX 424 as above described), to an AND gate 420 (for use in generating the discrepancy $d_n$), and to a like-subscripted intermediate flip-flop 402 (via a like subscripted MUX 430).

Thus, the convolution circuit of FIG. 4 includes a bank B400 of B registers (flip-flops) 400; a bank B401 of A registers (flip-flops) 401; and a bank B402 of intermediate registers (flip-flops) 402. As used herein, it should be understood that a flip-flop is a one bit register, and that registers having greater than one bit capacity can be utilized so long as other aspects of the invention are practiced. If the number of flip-flops in banks B400 and B401 are "m" (m=8 in the illustrated embodiment), the number of flip-flops in bank B402 is m-1.

For the circuit shown in FIG. 4, $\alpha^0$ is selected to make t=0, so that an $\alpha^{-t}$ multiplier for an inversion operation conducted by the circuit of FIG. 4 is a multiplication by 1 (thereby obviating illustration of an $\alpha^{-t}$ multiplier in FIG. 4).

As shown in FIG. 3B, each of the registers 400, 401, and 402 has a serial input terminal whereby a multibit value can be serially loaded therein. Moreover, each register 400, 401, 402 has associated therewith a loading switch (e.g., one or more multiplexers) for connecting its serial input terminal so that a selected one of a plurality of serial multibit values can be loaded therein. In particular, first register 400 has a first register loading switch 440; second register 401 has a second register loading switch 441; and third register 402 has a third register loading switch 442. More specifically, loading switch 440 comprises multiplexers 440A and 440B; loading switch 441 is a multiplexer; and loading switch 442 comprises multiplexers 443, 444, XOR gate 445, and AND gate 446. As described in more detail below, each loading switch is connected to a set of alternatively selectable input lines.

Both the first register 400 and the third register 402 have an associated feedback circuit which is optionally utilized in accordance with selection of respective loading switches 440 and 442. Specifically, first register 400 has feedback circuit 450 and third register 402 has feedback circuit 452. Each feedback circuit 450, 452 is connected to selected bits in its associate respective register 400, 402, for multiplying the contents of the respective registers 400, 402 by a feedback multiplier.

As illustrated hereinafter, values of the feedback multiplier for the feedback circuits 450, 452 are selectively changeable. In particular, the values of the feedback multipliers are selectively changeable by changing the selection of registers to which the feedback multiplier is connected. For example, the values of the feedback multipliers are selectively changeable in accordance with a field length of values being introduced into the associated registers 400, 402 (e.g., in accordance with whether 6 bit subcode bytes or 8 bit bytes are being processed).

Feedback circuit 450 comprises XOR gate 460; XOR gate 470; AND gate 480; XOR gate 490; and AND gate 494. XOR gate 460 has input terminals connected to bits 2 and 3 of register 400; XOR gate 470 has input terminals connected to bits 0 and 4 of register 400. These connections are in accordance with a particular field generator polynomial utilized in the present illustration; it should be understood that utilization of a different field generator polynomial would involve a different multiplier and accordingly different connections for XOR gates 460 and 470. The output of XOR gate 470 is applied to an input terminal of AND gate 480 and further applied to XOR gate 490 if signal ENA_L_ECC is high (ENA_L_ECC resulting from subcode accommodation portion 350 of the pre-processing subsection [see FIG. 3A] and being high when subcodes are not being processed). Otherwise, only the output of XOR gate 460 is passed to XOR gate 490 for use as the feedback multiplier. The fed-back multiplied value is applied from XOR gate 490 to one of a plurality of input terminals of MUX 440A.

It is noted in passing, and explained in more detail below in connection with basis conversion, that XOR gate 490 acts as an adder for adding whatever feedback signal is selected (either resulting from a four bit [ECC] connection for two bit [subcode] connection) with a value obtained from register 300(1). The value obtained from register 300(1) may be a six bit value (transmitted via MUX 354 and signal S1_ALPHA) when subcodes are being processed, or an eight bit value otherwise.

Similarly, feedback circuit 452 comprises XOR gate 462; XOR gate 472; AND gate 482; and XOR gate 492. XOR gate 462 has input terminals connected to bits 2 and 3 of register 402; XOR gate 472 has input terminals connected to bits 0 and 4 of register 402. As explained above in connection with feedback circuit 450, these connections are in accordance with a particular field generator polynomial utilized in the present illustration and it should be understood that utilization of a different field generator polynomial would involve a different multiplier and accordingly different connections for XOR gates 462 and 472. The output of XOR gate 472 is applied to an input terminal of AND gate 482 and further applied to XOR gate 492 if signal ENA_L_ECC is high as explained above. Otherwise, only the output of XOR gate 462 is passed to XOR gate 492 for use as the feedback multiplier. The fed-back multiplied value is applied from XOR gate 492 to one of a plurality of input terminals of MUX 443.

Output from feedback circuit 450 is just one of the selectable inputs applied to first register loading switch 440. Other selectable serial inputs include a constant value (applied on line R1_CONST_IN); the S_SUM value output by summation circuit 320 (see FIG. 3A); and a P_SUM value obtained from correction section 60. Similarly, third register loading switch 442 is connected to receive a plurality of alternate serial inputs, including the signal produced by feedback circuit 452; a constant value (applied on line R3_CONST_IN and via MUXes 444 and 443); the inner product value IP (applied via XOR gate 445, MUX 444, and MUX 443); and the contents of register 402 itself (on line R3(0) and via AND gate 446, XOR gate 445, and MUXes 444 and 443).

The second register loading switch 441 is also connected to receive a plurality of alternate serial inputs from which it selects. In particular, loading switch 441 selects between a constant value (applied on line R2_CONST_IN); the contents of storage register 300(0) or 300(1) [see FIG. 3A]; or the value P_SUM obtained from correction section 60. Thus, it is seen that the second bank loading switch 441 is connected to a plurality of input lines comprising a set of second bank serial input lines, one of the lines being connected to the first multibit storage register 300(0) and a second of the lines being connected to the second storage register 300(1).

Referring back to FIG. 3A, it is now understood that the second multibit storage register 300(1) is selectively connected to load therein a value from the first register 400 (via line R1(0) connected to MUX 310 (1)). Moreover, it is seen that input terminals of the summation circuit 320 are connected to the first storage register 300(0) [via line S0(0)]; to the second storage register 300(1) [via line S1(0)]; and to the inner product circuit 404 [via line IP]. Further, an output terminal of the summation circuit 320 is selectively connected to each of the first storage register 300(0) [via MUX 310(0)] and the second storage register 300(1) [via MUX 310(1)].

STRUCTURE

BASIS CONVERTER

FIG. 5 shows in more simplified and isolated fashion a basis converter circuit which is incorporated in calculator 30. Specifically, the basis converter includes the aforementioned bidirectional shift register 300(1); the first register 400; an adder (XOR gate 490); a feedback circuit (generally indicated as including adder 496); and a convert control AND gate 498. In FIG. 5, feedback adder 496 represents feedback multipliers (such as XOR gates 460 and 470 in FIG. 3B). Convert control AND gate 498 permits basis conversion when signal CONVERT applied thereto is high.

The circuit of FIG. 5 thus forms a bi-directional conversion unit for converting an m-bit input value from an input basis representation to an output basis representation. One of the input basis representation and the output basis representation is alpha basis representation and the other of the input basis representation and the output basis representation is beta basis representation. A field element $\alpha^0$ of the $\beta$ basis representation is selected so that a highest order bit thereof is one and the remaining bits thereof are zero (i.e., 1000 0000).

In the conversion unit of FIG. 5, bidirectional shift register 300(1) functions as an input register for storing the input value in the input basis representation and for serially outputting the input value in a preselected bit order in accordance with the input basis representation. Register 400 serves as a conversion memory and comprises a plurality of bit locations for storing a plurality of bits. Feedback multiplier 496 multiplies a current value in the conversion memory (i.e., register 400) by a feedback constant in order to generate a feedback factor. Adder 490, during each of m number of addition operations, adds corresponding bits of (1) the input value as outputted from the input register [300(1)] and (2) the feedback factor. Adder 490 produces a sum which is loaded into a highest order bit location of the conversion memory (register 400) and which, during any remaining addition operations, is serially shifted through the conversion memory.

The conversion unit of FIG. 5 thereby provides, in the conversion memory (i.e., register 400), at the end of m number of addition operations, the output basis representation of the m-bit input value. When the input basis representation is alpha basis representation, the input value is outputted (from register 300(1)) from a highest order bit thereof to a lowest order bit thereof. When the input basis representation is beta basis representation, the input value is outputted (from register 300(1)) from a lowest order bit thereof to a highest order bit thereof.

When the output basis is the alpha basis, the alpha basis representation is provided in register 400 in bit reversed order. However, the bits can easily be rearranged in non-reversed order by serially shifting the contents of register 400 back into the input register [register 300(1)] while the input register is shifted from low to high.

The operation of the basis converter of FIG. 5 is demonstrated below, for example, in the discussion entitled OPERATION: ERROR PATTERN GENERATION.

STRUCTURE

CORRECTOR

Figure 6:
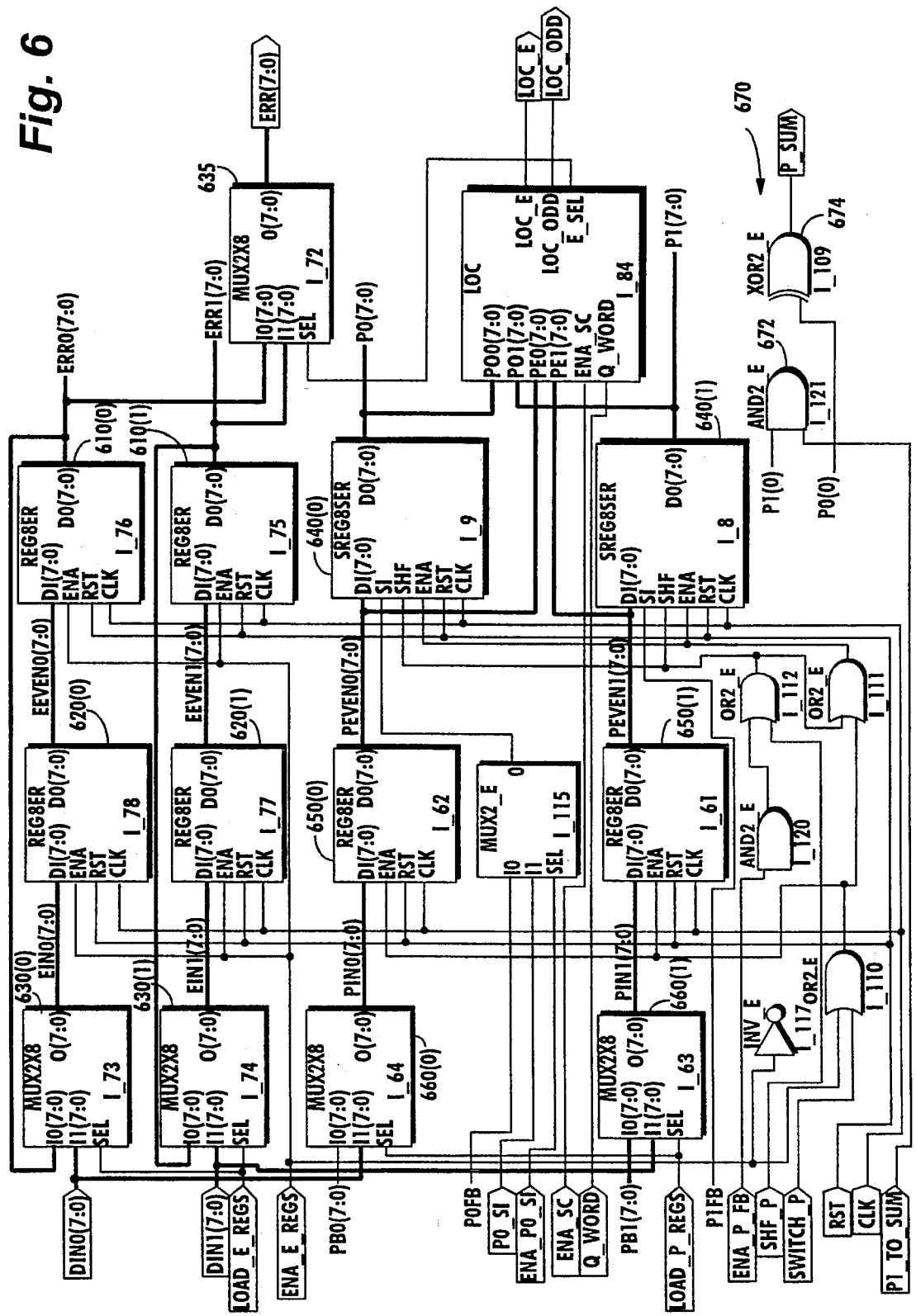
FIG. 6 is a schematic block diagram of a corrector section for the CD ROM error correction system of FIG. 1.

FIG. 6 shows aspects of corrector section 60 of the CD ROM error correction system of FIG. 1 which are here pertinent. Corrector 60 includes error-readout registers 610(0) and 610(1) and error intermediate registers 620(0) and 620(1) for storing two sets of error patterns, e.g., one set of error patterns for an even interleave codeword and one set of error patterns for an odd interleave codeword. As used herein, each set of error patterns is represented by the notation $E_0$, $E_1$. Error-readout registers 610(0) and 610(1) are fed by error intermediate registers 620(0) and 620(1), respectively. Feeding of error intermediate registers 620(0) and 620(1) is controlled by switches or multiplexers 630(0) and 630(1), respectively, which gate therein either parallel data received from calculator 30 or the parallel contents of the respective error-readout register 610(0), 610(1).

As shown in FIG. 6, parallel data obtained from calculator 30 is applied on bus DIN, and more particularly is obtained from storage registers 300(0), 300(1) of calculator 30 (bus DIN in FIG. 6 also representing signals applied from either bus S0 or S1 in FIG. 3A, buses S0 and S1 being the same as buses S02 and S12 shown in FIG. 1. The use of MUXes 630 to apply the contents of registers 610 to registers 620 allows for circulation of error values, which is valuable for storage and readout purposes.

Output terminals of error-readout registers 610(0) and 610(1) are connected to respective input terminals of error readout switch or MUX 635. MUX 635 outputs a selected one of the error patterns $E_0$, $E_1$ on bus ERR (see FIG. 6 and FIG. 1) for application both to EDC checker 70 and to controller 10.

Corrector 60 also includes pointer-readout registers 640(0) and 640(1) and pointer intermediate registers 650(0) and 650(1) for storing two sets of pointers e.g., one set of pointers for an even interleave codeword and one set of pointers for an odd interleave codeword. As used herein, each set of pointers is represented by the notation $P_0$, $P_1$, or $\alpha^{L0}$, $\alpha^{L1}$. In similar manner with the error registers, pointer readout registers 640(0) and 640(1) are fed by pointer intermediate registers 650(0) and 650(1), respectively. Feeding of pointer intermediate registers 650(0) and 650(1) is controlled by switches or multiplexers 660(0) and 660(1), respectively, which gate therein either parallel data received from calculator 30 or the parallel contents of the respective pointer-readout register 640(0), 640(1). The data received from calculator 30 is applied on bus DIN in like manner as above described with respect to the error patterns.

Corrector 60 also includes pointer summation circuit 670 which is controlled by signal P1_TO_SUM to serially add the pointer values from registers 640(0) and 640(1). Pointer summation circuit includes AND gate 672 and XOR gate 674.

STRUCTURE

EDC CHECKER

Figure 7:
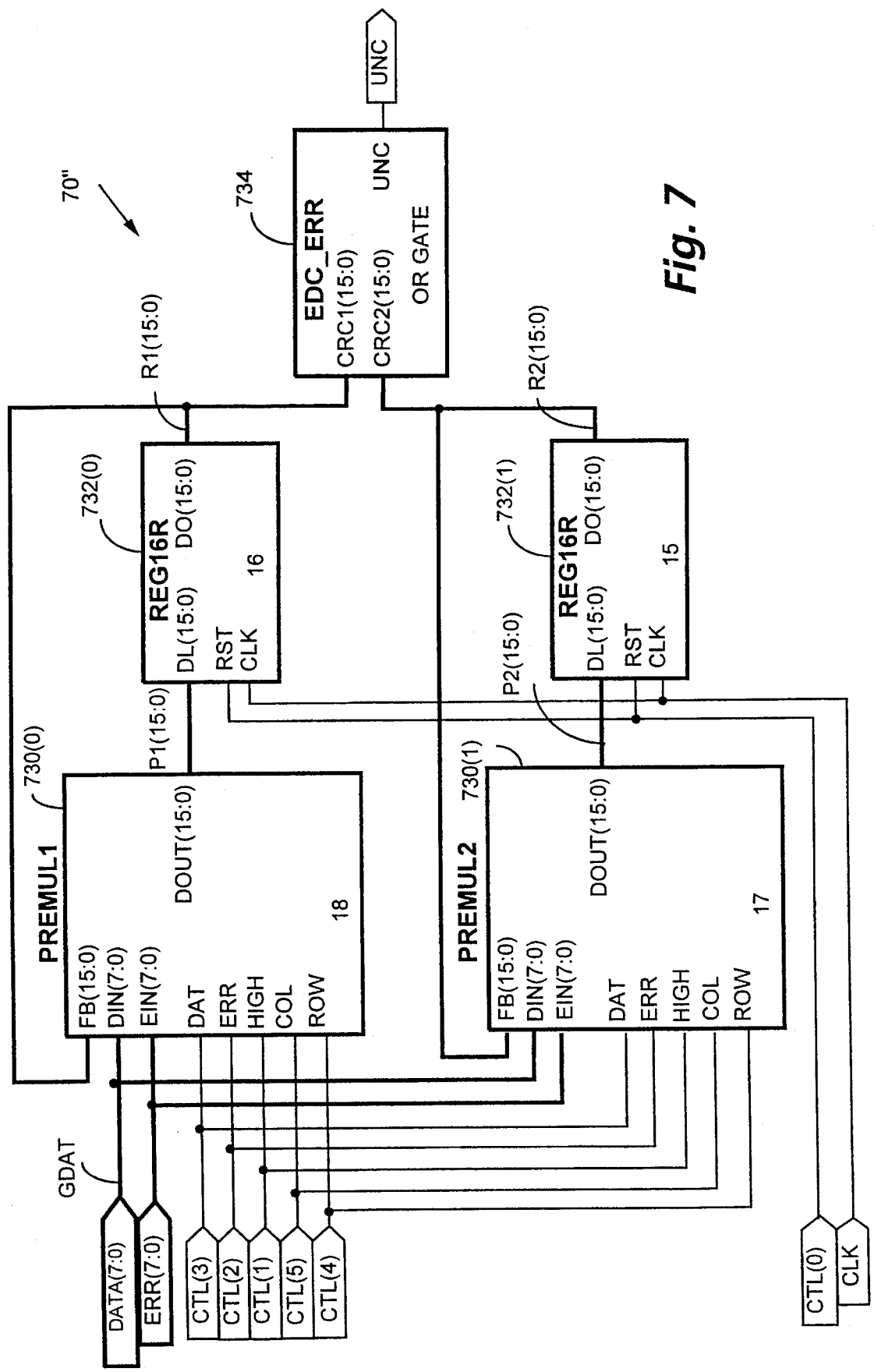
FIG. 7 is a schematic block diagram of an EDC checker section for the CD ROM error correction system of FIG. 1.

The EDC/CRC checker 70 is connected to receive serial error patterns from corrector 60 on line ERR(0) and serial buffer data on line GDAT(0), as shown generally in FIG. 1 and in more detail in FIG. 7. System controller 10 supervises the operation of EDC/CRC checker 70 using control bus CBUS.

As described in U.S. patent application Ser. No. 08/306,917, filed Sep. 16, 1994 by Chris Zook and entitled "CRC/EDC CHECKER SYSTEM", which is incorporated herein by reference, supervision of system controller 10 EDC/CRC checker 70 advantageously operates in coordination with corrector 60 to perform an EDC/CRC verification of correction accuracy during the same pass of the buffer in which bytes are being corrected.

OPERATION

COMPUTER DATA/POINTER MODE

OVERVIEW

Figure 9:
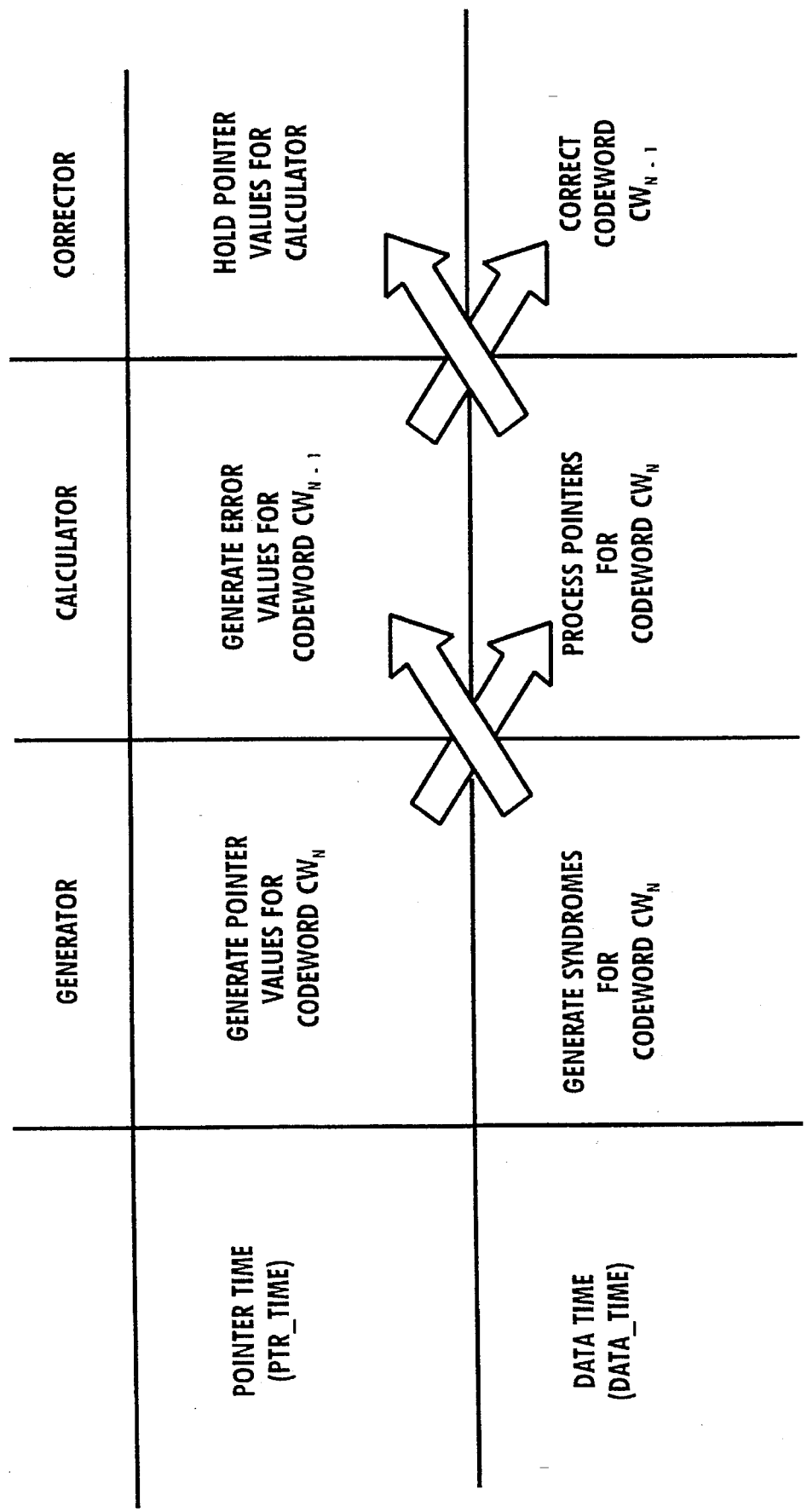
FIG. 9 is a chart showing a two-phased (computer data with pointers) operation of the CD ROM error correction system of FIG. 1.

The error correction system of FIG. 1 operates in two modes: (1) a two-phased mode for correcting computer data having pointers; and (2) a subcode mode for correcting subcode packs (see FIG. 8A) included with audio digital data. During the two-phased mode for correcting computer data with pointers, generator 20, calculator 30, and corrector 60 are each operated during two phases, as schematically illustrated in FIG. 9. Specifically, during a first phase (known as pointer time or PTR_TIME):

(a) generator 20 uses one bit buffer-obtained pointer(s) for a most-recent codeword $CW_n$ to generate one or two multi-bit buffer-obtained pointers ($\alpha^{L0}=P_0$, $\alpha^{L1}=P_1$) for the most-recent codeword;

(b) calculation section 30 uses the syndromes ($S_0$, $S_1$) generated by generator (20) for a previous codeword $CW_{n-1}$ to generate one or two error patterns ($E_0$, $E_1$) for the previous codeword; and (c) correction section 60 holds pointer values ($\alpha^{L0}=P_0$, $\alpha^{L1}=P_1$) for a previous codeword $CW_{n-1}$ for calculation unit 30.

During a second phase (shown as data time or DATA_TIME in FIG. 9):

(a) generator 20 generates syndromes ($S_0$, $S_1$) for the most-recent codeword $CW_n$;

(b) calculation section 30 performs a mathematical operation with respect to any multi-bit buffer-obtained pointers (i.e., ) for the most-recent codeword $CW_n$; and (c) correction unit 60 corrects the previous codeword $CW_{n-1}$.

In each of the two phases, the generation section 20, calculation section 30, and correction section 60 wait upon the last-to-finish section before the entire system can proceed to the next phase.

When reference is made herein to the most-recent codeword or the previous codeword, it should be understood in the context of the system of FIG. 1 that each such reference is actually to two codewords (e.g., two most-recent codewords and two previous codewords), since the system as illustrated in FIG. 1 essentially simultaneously handles bytes from both an even interleave codeword and an odd interleave codeword. However, the principles of the present invention are not confined to an interleaved system, as it should be clear that the two-phased operation as described herein as applicability also to a non-interleaved system wherein sections at least analogous to each of the generation section 20, calculation section 30, and correction system 60 operate on a single codeword.

The present system thus differs from conventional pipelining techniques which require three simultaneous stages/operations, each stage/operation using different inputs and in general passing inputs from one stage to the next. Sections 20, 30, and 60 of the present system each handle two different operations in a time division manner. Moreover, each section 20, 30, and 60 performs two functions, depending on the phase of operation. At the end of a phase of operation, each section 20, 30, 60 passes information to another section, but does not then repeat the same operation in the next phase. Rather, during the following phase, each section 20, 30, 60 performs a different operation, as summarized above and described in more detail below.

OPERATION

POINTER GENERATION (COMPUTER DATA/POINTER MODE)

AS indicated above, operations conducted in the computer data/pointer mode the system of the present invention as herein illustrated involve both an even interleave codeword and an odd interleave codeword. In view of the illustrated paired processing of an even interleave codeword with an odd interleave codeword, it should be understood in the ensuing description that any generic reference to a codeword is applicable to either an even interleave codeword or an odd interleave codeword. Further, as explained at various junctures below, values generated with respect to an even interleave codeword might at any moment be stored in one or more first register(s), while values generated with respect to an odd interleave codeword might at that moment be stored in one or more second register(s).

Assuming that the computer data/pointer mode is at a time in execution that a new codeword is to be processed, i.e., a most recent codeword $CW_n$, the first action taken with respect to codeword $CW_n$ in PTR_TIME is to generate a byte of buffer pointer information in $\alpha^L$ representation for each of as many as two pointers. It will be understood by the person skilled in the art that the buffer has stored therein a buffer pointer bit location for each byte of each codeword. If the bit location for a byte is set, a buffer pointer is said to occur or exist with respect to the codeword byte corresponding to the set bit location.

As used herein, the term "buffer" pointer is employed to denote pointers obtained from the buffer in the afore-described manner. All references herein to a "pointer(s)" is to be understood as meaning a buffer pointer, unless clearly identified to the contrary as a "system" pointer. The generation and utilization of system pointers is described below in connection with OPERATION: POINTER PROCESSING.

Under supervision of system controller 10, generator 20 generates a byte of pointer information in $\alpha^L$ representation for each pointer during the stage known as PTR_TIME. In this respect, as the pointer bits for a codeword are sequentially accessed in a clocked manner in the buffer, a pointer signal is applied to system controller 10 when a first set pointer bit is encountered. System controller 10 correlates the clocking of bits in the buffer with codeword byte positions and accordingly notes the codeword byte position for which the pointer signal is generated for the first pointer.

Upon receipt of a pointer signal, system controller 10 sets bit 0 on bus GDAT which is applied to gate 202 and to generator controller 200. A pointer initializing value (i.e., 1) is loaded into register 206(0). Generator controller 200 also applies signals to the versatile feedback circuit 210(0) to configure the multiplication constant therefor (see FIG. 2A). In particular, since eight bit pointer bytes are being produced, system controller 10 applies signal ENA_SC to MUX 230 and generator controller 200 applies signal ENA_MUL to MUX 240 so that the multiplier constant $\alpha$ of multiplier 228 is operative in feedback circuit 210(0). Then, as clocking through of pointer bits in the buffer continues, with each clock until the last clock of the codeword, the developing pointer byte is shifted to register 208(0), multiplied by the multiplier constant, and stored in register 206(0), ultimately resulting in a pointer byte having the format $\alpha^L$.

The first pointer byte is representationally referred to herein as $\alpha^{L0}$ or $P_0$. For example, if the first pointer bit were set for the twentieth byte of a codeword, the first pointer byte would be $\alpha^6$ (there being four subsequent clocks/bytes remaining to the end of the 24-byte data portion of the codeword and two ECC bytes in the codeword, for a total of 26 bytes in the codeword).

Should a second pointer bit be encounter in the buffer with respect to the codeword, bit GDAT(0) is again set, applied to generator controller 200 and gate 202, and noted by generator controller 200 as corresponding to the second pointer. In this respect, generator controller 200 counts the number of pointer bits encountered for a codeword and outputs signal PCNT indicative thereof. Generator controller 200 notes that the second pointer has been encountered, and so notifies gate 202 by setting signal ENA_P1. Gate 202 responds by loading a pointer initializing value into register 206(1), and conducting [in parallel with respect to register 206(1), 208(1), feedback circuit 210(1), and adder 204(1)] the same operations as just described with respect to the first pointer. The second pointer will be encountered at a later point in the clocking through of the codeword (e.g., for byte 22), so that the multiplication for the second pointer byte will commence at a corresponding later stage. The second pointer byte is representationally referred to herein as $\alpha^{L1}$ or $P_1$. In the example in which the second pointer bit occurred for byte 22 of the codeword, the second pointer byte will be $\alpha^4$.

After generation of the pointer bytes (either $P_0$, or both $P_0$ and $P_1$ for a two pointer codeword), the pointer bytes are loaded in parallel from corresponding registers 208(0), 208(1) into the calculation section 30, eventually residing in respective registers 300(0), 300(1) for use by calculation section 30 during the following phase (DATA_TIME). The foregoing description of generation of pointer bytes concerned the most recent codeword from one interleave. It should be understood that, during each PTR_TIME phase, the foregoing pointer byte generation operation occurs first with respect to an even interleave codeword and then with respect to an odd interleave codeword. After generation, pointer bytes for the odd interleave codeword are also loaded into the calculation section, particularly into registers 302(0) and 302(1).

After the pointer bytes for both the most recent even interleave codeword and the most recent odd interleave codeword have been loaded into the calculation section, processing of the pointer bytes is conducted by calculation section 30 during the immediately following phase (DATA_TIME). In this regard, see the discussion below subtitled OPERATION: POINTER PROCESSING.

Should the number of pointers for a codeword exceed two, such value applied as signal PCNT will indicate that the codeword is uncorrectable.

OPERATION

SYNDROME GENERATION (COMPUTER DATA/POINTER MODE)

After generator 20 has finished generating one or more pointer bytes for the most recent codeword $CW_n$ during phase PTR_TIME, generator 20 awaits commencement of the next phase (DATA_TIME). During DATA_TIME, generator 20 generates two syndromes (representationally denoted herein as $S_0$ and $S_1$) per codeword, e.g., for the most recent codeword $CW_n$.

For generation of syndromes, feedback circuit 210(0) is configured to generate syndrome $S_0$ by utilizing the non-multiplying feedback line 220. Feedback circuit 210(1) is configured to generate syndrome $S_1$ by implementing multiplication by the eight bit multiplier 228 (in much the same manner as aforedescribed with respect to pointers).

Initially, the first byte of the most recent codeword from the even interleave is gated into both register 206(0) and register 206(1) and then shifted into corresponding registers 208(0), 208(1). Next, the first byte of the most recent codeword from the odd interleave is gated into both register 206(0) and register 206 (1). This is followed by gating the second byte of the most recent codeword from the even interleave into adders 204(0), 204(1) with respect to the even interleave codeword. Adder 204(0) adds the second byte to the first byte; adder 204(1) adds the second by the an $\alpha$ multiple of the first byte. The sums from adders 204(0) and 204(1) are loaded into registers 206(0), 206(1), respectively. Then the second byte of the most recent codeword from the odd interleave is gated into adders 204(0), 204(1). With respect to the odd interleave codeword, adder 204(0) adds the second byte to the first byte; adder 204(1) adds the second by the an $\alpha$ multiple of the first byte. The even interleave syndromes-in-process are shifted into registers 208(0), 208(1), while the sums from adders 204(0) and 204(1) with respect to the odd interleave codeword are loaded into registers 206(0), 206(1), respectively.

The foregoing steps are repeated for the remainder of each codeword, e.g., for all twenty six bytes or forty five of the most recent codeword $CW_n$ (depending on whether it is a column or diagonal codeword). The order in which the codeword bytes are processed is depicted by a column in FIG. 8B. That is, with respect to the first column codeword of the even interleave, byte 0000 is first processed, followed by byte 0043, followed by byte 0086, continuing to byte 1075.

Upon conclusion of syndrome generation for a pair of most recent codewords $CW_n$, syndrome $S_0$ for the even interleave codeword is stored in register 208(0); syndrome $S_1$ for the even interleave codeword is stored in register 208(1); syndrome $S_0$ for the odd interleave codeword is stored in register 206(0); syndrome $S_1$ for the odd interleave codeword is stored in register 206(1). As described below (see OPERATION: ERROR PATTERN GENERATION), these syndrome values are utilized during the immediately following phase (PTR_TIME) by calculation section 30 to generate error patterns.

OPERATION

POINTER PROCESSING (COMPUTER DATA/POINTER MODE)

As indicated above (see OPERATION: POINTER GENERATION), during the phase PTR_TIME, generation section 20 has generated as many as two pointers bytes ($P_0$, $P_1$, alias $\alpha^{L0}$, $\alpha^{L1}$) for both an even interleave codeword and an odd interleave codeword. At the beginning of the following phase DATA_TIME, the pointer bytes have been stored as follows: $P_0$ and $P_1$ for the odd interleave codeword in registers 300(0) and 300(1) respectively; $P_0$ and $P_1$ for the even interleave codeword in registers 302(0) and 302(1), respectively.

During DATA_TIME, calculation section 20 processes pointers $P_0$, $P_1$ for both the odd interleave codeword and the even interleave codeword. For the odd interleave codeword, for which processing occurs first, the processing performed by calculator 30 during DATA_TIME is a basis conversion of odd codeword pointers $P_0$, $P_1$ (into $\beta$ basis representation). For the even interleave codeword, which is processed next, the processing performed by calculator 30 during DATA_TIME not only involves conversion of the even codeword pointer $P_0$, $P_1$ to $\beta$ basis representation, but (when two pointers exist) also includes formation of an inverted sum with the basis-converted pointers in the manner described below.

For each codeword, processing by calculation section 30 occurs in one of two cases. The first case is implemented when at most one buffer pointer was generated with respect to a codeword. The second case is implemented when two buffer pointers were generated with respect to a codeword.

For the buffer pointer processing of case 1, calculation section 30 converts the one pointer $P_0$ (if present) from $\alpha$ basis representation into $\beta$ basis representation. For the buffer pointer processing of case 2, calculation section 30 converts both pointer $P_0$ and pointer $P_1$ from $\alpha$ basis representation to $\beta$ basis representation, and using the $\beta$ basis representation calculates the following expression (known hereinafter as the two pointer inverted sum):

$$\frac{1}{\alpha^{L0} + \alpha^{L1}}$$

also written as $$\frac{1}{P_0 + P_1}$$

Calculation section 30 forms the two pointer inverted sum for the even interleave codeword in phase DATA_TIME. If a two pointer inverted sum need be formed for the odd interleave codeword, such pointer inverted sum is formed during the immediately following phase POINTER_TIME.

Processing of pointers is illustrated in FIG. 10. Steps 1002 - steps 1016 of FIG. 10 are executed by calculation section 30 during phase DATA_TIME. Steps 1020–steps 1024 are executed during the immediately following POINTER_TIME phase.

At step 1002, calculation section 30 converts $P_0$, $P_1$ for the odd interleave codeword to $\beta$ representation. Then, at step 1004, the $\beta$-converted pointers $P_0$, $P_1$ for the odd interleaved codeword are moved into registers 302(0), 302(1), for temporary storage. Essentially simultaneously, at step 1006 the un-converted pointers $P_0$, $P_1$ for the even interleave codeword are moved from registers 302(0), 302(1) into registers 300(0), 300(1) in anticipation of basis conversion. Conversion to the $\beta$ basis for pointers $P_0$, $P_1$ of the even codeword occurs at step 1008. At step 1010, an inverted sum for the even codeword is formed in register 401, where it remains until the next phase.

At step 1014, all pointers are moved into the correction section 60 for temporary storage. In this regard, at step 1012, pointers $P_0$, $P_1$ for the even codeword are moved from registers 300(0), 300(1) into pointer registers 640(0), 640(1), respectively; pointers $P_0$, $P_1$ for the odd codeword are moved from registers 302(0),302(1) into pointer registers 650(0), 650(1), respectively. Along with parallel serial shifting of pointers into correction section 60, syndromes generated by generator 20 are shifted into registers 300, 302 (reflected by step 1016).

During POINTER_TIME, after processing of error values for the even interleave codeword (depicted by step 1018), at step 1020 the correction section 60 adds pointers $P_0$, $P_1$ for the odd codeword by serially outputting values thereof from registers 640(0), 640(1), respectively, into summation circuit 670. The sum produced by summation circuit 670 (the serial bits on P_SUM) are loaded via MUX 441 into register 401 (step 1022). At step 1024, calculation section 30 forms the inverse of the $P_0+P_1$ sum of the odd codeword in register 401. Thereafter, as depicted by step 1026, the calculation section 30 processes error values for the odd interleave codeword.

The basis conversion, addition, and inversion operations performed by calculation section 30 illustrate the versatility of calculation section 30. These operations are discussed in more detail below.

Steps involved in the conversion of pointers $P_0$, $P_1$ into $\beta$ basis representation are depicted in FIG. 11. Pointer $P_0$ resides in register 300(0). At step 1102, pointer $P_0$ is loaded (on line S0(0) via MUX 441) into register 401. At step 1104 the constant "1" (on line R1_CONST_IN) is loaded (via MUX 440) into register 400. A bit-oriented convolution operation is conducted (step 1106), with bits of the inner product of registers 400 and 401 being serially outputted as signal IP. During the bit-oriented convolution, α-feedback is applied to register 400 via ADDER 490 and feedback circuit 450. The value serially outputted as signal IP is pointer $P_0$ in the β basis representation. At step 1108, pointer $P_0$ in the β basis representation is loaded into back into register 300(0) by routing through AND gate 324, XOR gate 328, XOR gate 330, MUX 310(0) to register 300(0).

If pointer $P_1$ exists, the remaining steps of FIG. 11 are executed. In this regard, pointer $P_1$ resides in register 300(1). At step 1112, pointer $P_1$ is loaded (on line S1(0) via MUX 441) into register 401. In like manner with step 1104, the constant "1" (on line R1_CONST_IN) is loaded (via MUX 440) into register 400. A bit-oriented convolution operation is conducted (step 1114), with bits of the inner product of registers 400 and 401 being serially outputted as signal IP. During the bit-oriented convolution, α-feedback is applied to register 400 via ADDER 490 and feedback circuit 450. The value serially outputted as signal IP is pointer $P_1$ in the β basis representation. At step 1116, pointer $P_1$ in the β basis representation is loaded into back into register 300(1) by routing through AND gate 324, XOR gate 328, and MUX 310(1) to register 300(1).

Figure 12:
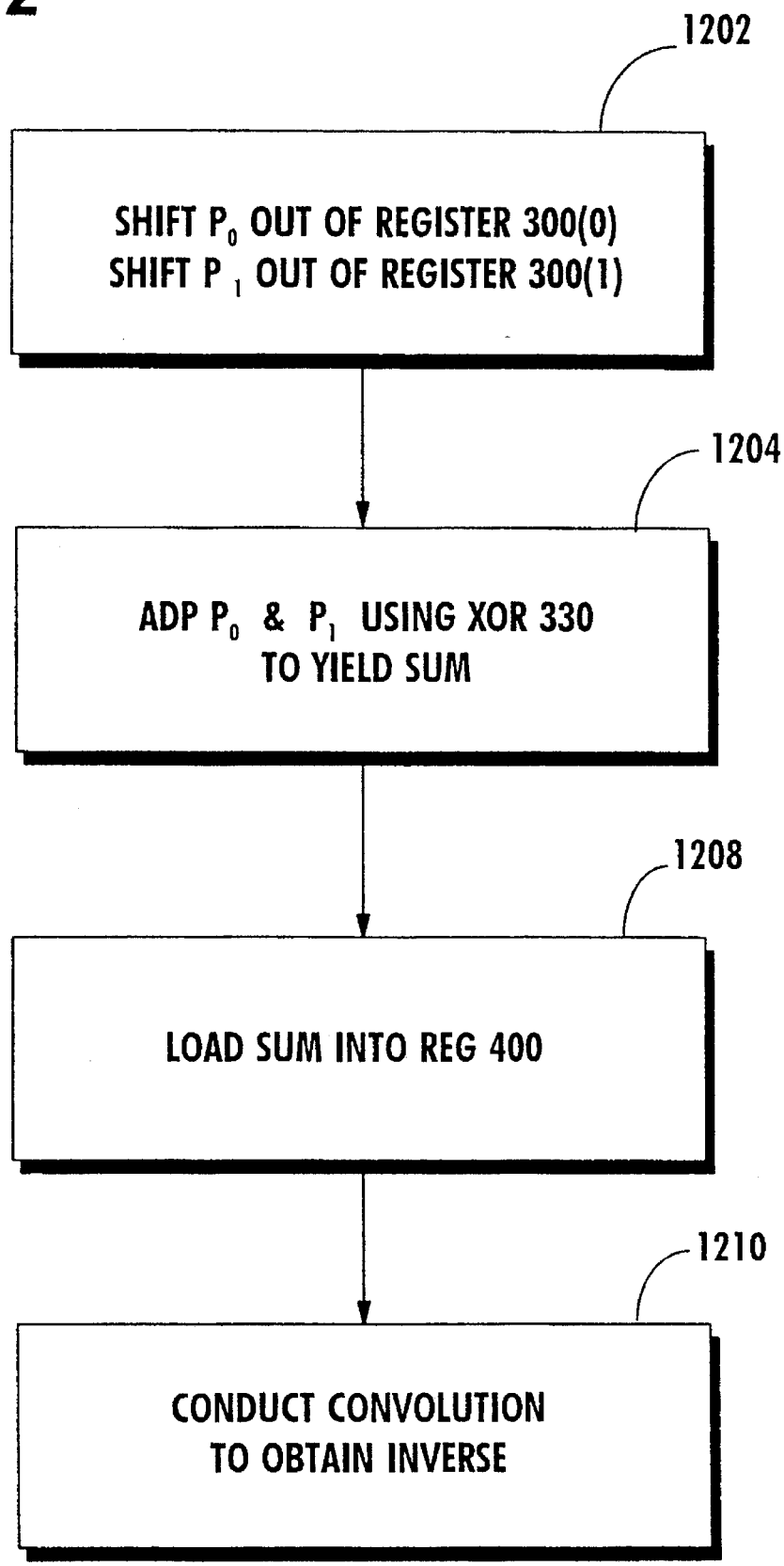
FIG. 12 is a flowchart illustrating various steps executed by a calculation circuit of the invention in connection with a case 2 of buffer pointer processing.

Case 2 subsumes the case 1 conversion of pointers $P_0$ and $P_1$ to the β basis representation. Steps involved in the addition and inversion computations of case 2, subsequent to the conversion of pointers $P_0$ and $P_1$ from the α basis representation to the β basis representation, are shown in FIG. 12. It will be recalled that converted pointers $P_0$ and $P_1$ are in registers 300(0) and 300(1), respectively, At step 1202, pointer $P_0$ is serially shifted out of register 300(0) through AND gate 322 to XOR gate 330, while pointer $P_I$ is serially shifted out of register 300(1) through AND gates 326, and XOR gate 328 to XOR gate 330. At step 1204, $P_0$ and $P_1$ are added by XOR gate 330, with the sum appearing as serial signal S_SUM.

An inversion operation is then formed with respect to the $P_0+P_1$ sum. At step 1208, the $P_0+P_1$ sum is loaded into register 400. At step 1210, a bit-oriented convolution is conducted using registers 400 and 401. During the bit-oriented convolution, α-feedback is applied to register 400 via ADDER 490 and feedback circuit 450. As understood from the incorporated herein U.S. patent application Ser. No. 08/147,758, filed by Chris Zook on Nov. 4, 1993 and entitled "FINITE FIELD INVERSION", the convolution generates and stores electrical signals corresponding to an m-bit value in register 401. The value in register 401 is in a first basis representation and is generated by the convolution such that an inner product of register 400 (containing the sum $P_0+P_1$ in β basis representation) and $\alpha^k B$ (where B is the value in register 401) is equal to 0 for k<m−1. Thus, the convolution yields the inversion of the $P_0+P_1$ sum in register 401, with the yielded inverse $(P_0+P_1)^{-1}$ being in α basis representation. It is again noted, in connection with the inversion operation, that in the circuit shown in FIG. 4, $\alpha^0$ is selected to make t=0, so that an $\alpha^{-t}$ multiplier for an inversion operation conducted by the circuit of FIG. 4 is a multiplication by 1.

Upon completion of DATA_TIME, the two pointer inverted sum (if required to be generated) for the even interleave codeword resides in register 401, syndromes for the even interleave codeword and odd interleave codeword are stored in registers 300, 302, respectively, and pointers for the even codeword are stored in registers 640 while pointers for the odd codeword are stored in registers 642.

OPERATION

ERROR PATTERN GENERATION (COMPUTER DATA/POINTER MODE)

As described above, syndromes $S_0$, $S_1$ were generated for both an even interleave codeword and an odd interleave codeword by generator 20 during an the phase DATA_TIME. In the PTR_TIME phase immediately following generation of syndromes for a codeword, calculation section 30 generates as many as two error patterns ($E_0$, $E_1$) for the codeword. In the PTR_TIME phase, calculation section 30 first generates error patterns for the even interleave codeword and then generates error patterns for the odd interleave codeword.

Figure 14:
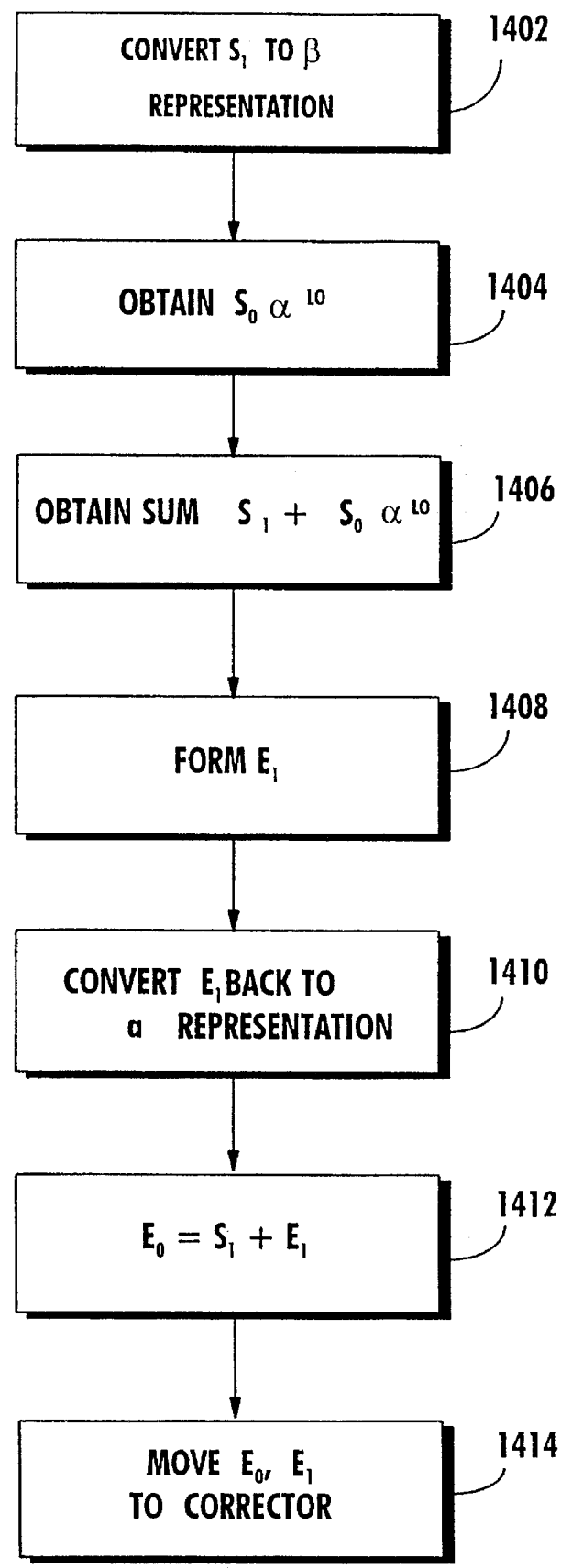
FIG. 14 is a flowchart illustrating basic steps involved in a second case of error pattern generation.

Error pattern generation for a codeword occurs in one of two cases. A first case of error pattern generation occurs when a codeword has less than two pointers. A second case of error pattern generation occurs when a codeword has two pointers. The first case of error pattern generation is illustrated by FIG. 13; the second case of error pattern generation is illustrated by FIG. 14.

In the first case, should there be a single error pointer ($P_0$) for a codeword, the sole error pattern for that codeword will be $S_0$. That is, the error pattern $E_0$ for the codeword is $S_0$, i.e., $E_0=S_0$ ($S_0$ being the first syndrome for the codeword). However, for this single error case, calculation section 30 generates its own system pointer (as opposed to buffer pointer) for the error, and then ensures that the system pointer and buffer pointer both point to the same byte of the codeword.

The first case error pattern generation scenario operates in view of the following relationship:

$$\frac{S_1}{S_0} = \alpha^L \rightarrow S_1 = S_0 \alpha^L$$

If the foregoing relationship holds true, the existence of a single error is confirmed.

In the above regard, at step 1302 of FIG. 2 the calculation section 30 endeavors to compute a system pointer. Details involved in step 1302 include several substeps. At substep 1302-2, $S_0$ is converted into β basis representation (in a manner understood from previous discussion) and moved into register 402. Similarly, at substep 1302-4, $S_1$ is converted into β basis representation and moved into register 300(1). Then, at substep 1302-6, the constant $\alpha^{-1}$ is loaded into register 400 (via MUX 440) and the constant $\alpha^0$ is loaded into register 401 (via MUX 441). At step 1302-8, a bit-oriented convolution is conducted with registers 400 and 402 clocked with feedback. In connection with step 1302-8, MUXes 440 and 443 are operated to permit feedback addition from respective feedback circuits 450, 452. During the convolution, the value $S_0\alpha^L$ is held in register 402. As the convolution occurs, as indicated by sub-step 1302-10 the contents of register 402 (the value $S_0\alpha^L$) is added to $S_1$ (contained in register 300(1)) by adder 362 of comparison circuit 350. When the values $S_0\alpha^L$ and $S_1$ are equal (as detected by OR gate 372), a signal SEDB turns off. If signal SEDB does not turn off (determined at substep 1302-12), the codeword is determined to be uncorrectable (substep 1302-14). If and when signal SEDB turns off, the value in register 400 becomes a computed system pointer for the codeword (substep 1302-16).

Having computed the system pointer at step 1302, at step 1304 calculation circuit 30 ensures that the system pointer is the same as the buffer-supplied pointer. To effect the comparison, at substep 1304-2 the system pointer is moved from register 400 into register 402. At substep 1304-4 the buffer pointer is moved into register 400. The system pointer (routed via summer 362) is added (substep 1304-6) to the buffer pointer by summer 364 (see FIG. 3A). An output signal ROOT generated by comparison circuit 360 is turned on if the pointer values are equal. If ROOT does not go high (substep 1304-8), the codeword is uncorrectable (substep 1304-10). When ROOT goes high, the buffer pointer is confirmed (substep 1304-12).

With the buffer pointer confirmed to be correct at step 1304, at step 1306 the buffer pointer is moved back into the $P_0$ pointer registers of the correction section 60. Since there is only one error, just prior to the move, the buffer pointer value in register 400 is clocked with feedback ($\alpha^8$), so that the buffer pointer becomes an offset buffer pointer (e.g., $\alpha^{L+8}$). The $P_1$ pointer register is set to zero for this codeword in correction section 60 (step 1308). At the end of the first case error pattern generation, the error pattern $S_0=E_0$ remains (in $\alpha$ basis representation) in register 300.

During the second case error pattern generation, two error values ($E_0$, $E_1$) are computed by calculation section 30. These two error values are computed as follows:

$$E_1 = \frac{S_1 + S_0 \alpha^{L0}}{\alpha^{L0} + \alpha^{L1}}$$

$$E_0 = S_0 + E_1$$

Thus, the determination of $E_1$ must precede the determination of $E_0$.

FIG. 14 illustrates basic steps involved in the second case of error pattern generation. At step 1402, the syndrome $S_1$ (in $\alpha$ basis representation) is converted to the $\beta$ basis representation by using essentially the basis converter circuit of FIG. 5. Conversion is accomplished by enabling signal S1—L2H (allowing $S_1$ to be read out serially beginning with the highest order bit and continuing to the lowest order bit) and clocking feedback from feedback circuit 450, so that $S_1$ (being read in inverted bit order) is bit added to the feedback signal, thereby yielding the $\beta$ basis representation of $S_1$ in resister 400.

Upon completion of basis conversion, the $\beta$-converted $S_1$ value is moved back into register 300(1). The buffer pointer $P_0$ (in the form $\alpha^{L0}$) is moved from correction section 60 into register 400 and $S_0$ is moved into register 401 and simultaneously the previous contents of register 401 [i.e., $(P_0+P_1)^{-1}$] is moved temporarily to the correction unit 60. At step 1404, the factor $S_0\alpha^{L0}$ is obtained by clocking register 400 with feedback, thereby obtaining a desired sequence of inner product signals on line IP. The term $S_1+S_0\alpha^{L0}$ is obtained at step 1406 by using summation circuit 320 to add the serial sequence on line IP with the contents ($S_1$) of register 300(1). The contents of register 300(1) $[S_1+S_0\alpha^{L0}]$ is then moved into register 400. Then, at step 1408, the product for $E_1$ is formed by multiplying the factor $$\frac{1}{\alpha^{L0} + \alpha^{L1}}$$

(obtained from the pointer register $P_0$ (i.e., register 640(0)) and moved into register 401) by the factor $S_1+S_0\alpha^{L0}$ stored in register 400. The multiplication occurs during a bit-oriented convolution as register 400 is clocked with feedback via feedback circuit 450. The sequence of inner products generated as signal IP is applied to register 300(1), and becomes $E_1$.

Step 1410, step 1412, and step 1414 are implemented to obtain $E_0$. At step 1410, $E_1$ is converted from $\beta$ basis representation back to $\alpha$ basis representation using essentially the basis conversion circuit of FIG. 5. Such conversion occurs by moving $E_1$ from register 300(1) into register 400 (via AND gate 482) and bit-adding clocked feedback from feedback circuit 450. Then $E_1$ (now in bit-reversed $\alpha$ basis representation in register 400) is moved to register 300(1). $S_0$ (still in $\alpha$ basis) has remained in register 300(0) while register 300(1) shifts from low to high. At step 1412, the sum $S_0+E_1=E_0$ is obtained by summation circuit 320, and put back into register 300(0). Then, with both error pattern values $E_0$ and $E_1$ having been calculated, at step 1414 the error patterns $E_0$, $E_1$ for the codeword are moved into the error registers of the correction section 60.

OPERATION

CORRECTION (COMPUTER DATA/POINTER MODE)

When correcting a pair (even interleave and odd interleave) of codewords, correction section 60 has stored verified pointers $P_0$, $P_1$ in its pointer registers 640, 650 and error patterns $E_0$, $E_1$ in its error registers 610, 620. Correction section 60 accesses the block being processed in the buffer during phase DATA_TIME for correction purposes. Each codeword in the block is accessed during a successive clock cycle. When a pointer for the codeword (as output on line LOC_E in FIG. 6) corresponds to a currently clocked byte of the codeword, the corresponding error pattern ($E_0$ or $E_1$) applied on via MUX 635 to bus ERR is used to correct the erroneous byte in the buffer. Simultaneously with this correction process, EDC checker system 70 is performing a CRC check with respect to a block of the buffer (see OPERATION: EDC CHECKING).

OPERATION

OVERVIEW (AUDIO WITH SUBCODES)

Figure 15A:
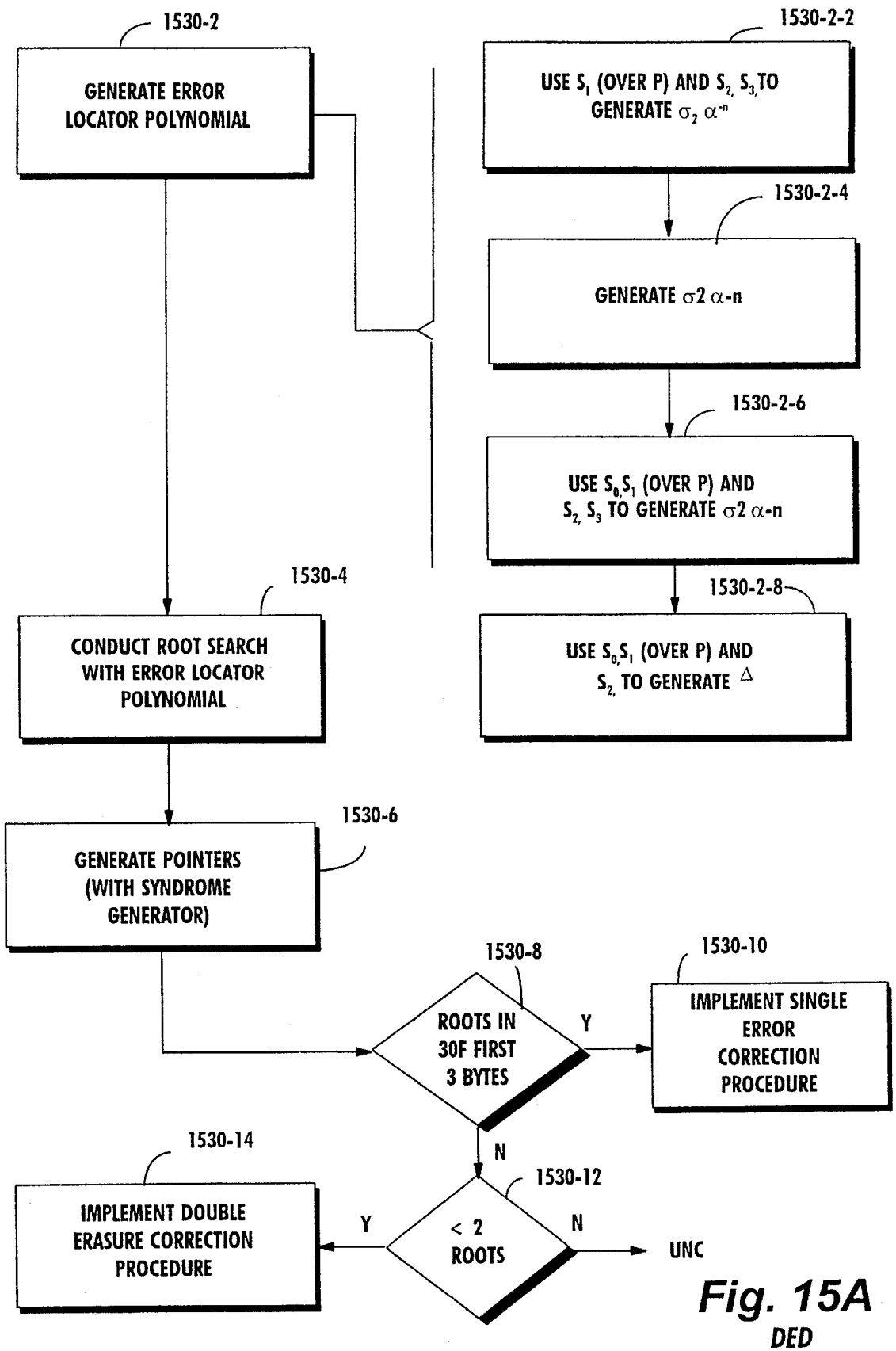
FIG. 15A is a flowchart showing steps involved in a DOUBLE ERROR DETECTION (DED) operation for subcodes.
Figure 15B:
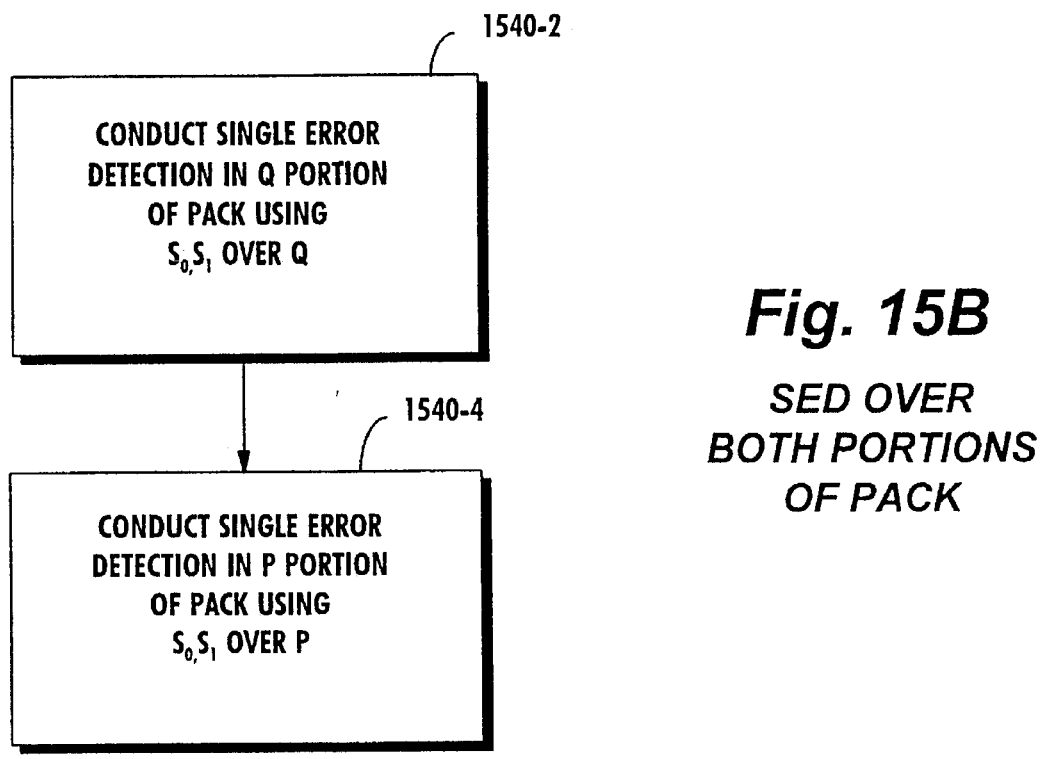
FIG. 15B is a flowchart showing steps involved in a SINGLE ERROR DETECTION (SED) operation for subcodes.
Figure 15C:
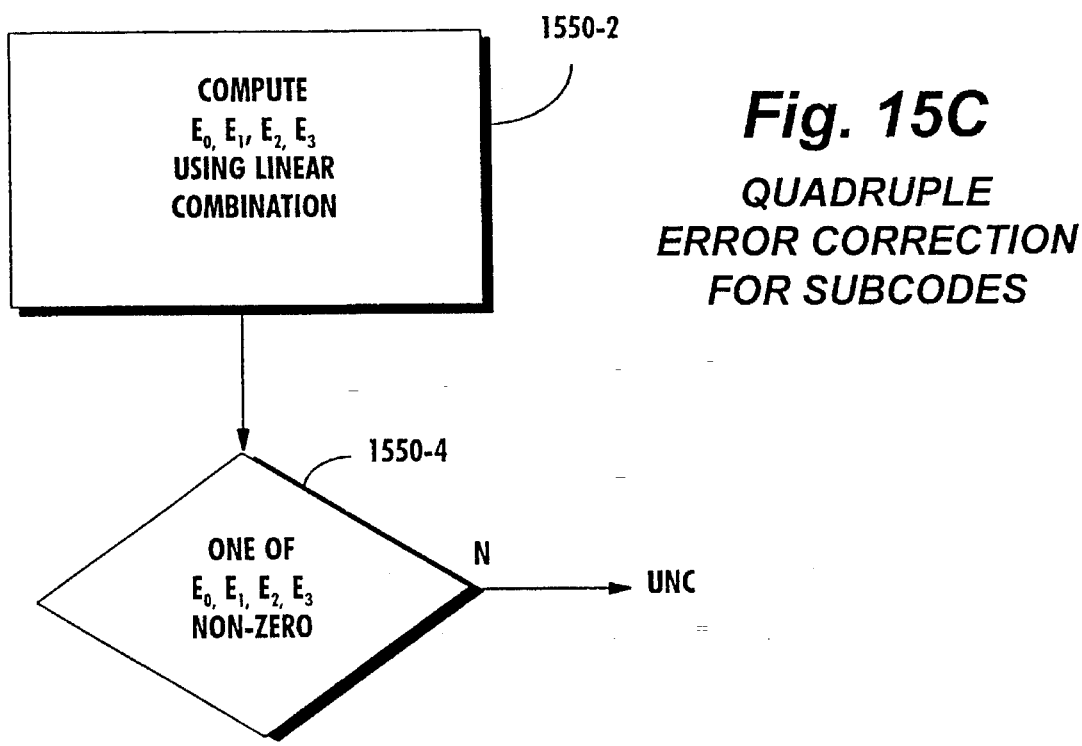
FIG. 15C is a flowchart showing steps involved in a QUADRUPLE ERASURE CORRECTION operation for subcodes.

The subcode mode of operation is summarized by the basic steps depicted in FIG. 15. In the subcode mode, the error correction system of FIG. 1 attempts to perform correction with a subcode pack (illustrated in FIG. 8A) dispersed within digital audio data.

Step 1510A and step 1510B involve generation of syndromes with respect to the pack. During step 1510A, the first four bytes (the "Q" portion of the pack) are utilized for generating syndromes $S_0$, $S_1$ over the Q portion and for beginning generation of syndromes $S_2$, $S_3$ over the entire pack. During step 1510B, the remaining bytes of the pack (e.g., the "P" portion of the pack) are utilized for finishing generation of $S_2$, $S_3$ over the entire pack and for generating syndromes $S_0$, $S_1$ over the "P" portion of the pack. As understood with respect to FIG. 8A, in the illustrated embodiment the first or "Q" portion of the pack constitutes the first four six-bit bytes (e.g., symbols 0–3) while the second or "P" portion of the pack constitutes the remaining twenty six-bit bytes (e.g., symbols 4–23). In general, the first or "Q" portion of the pack is used, among other things, for pack identifying information, while the second or "P" portion of the pack includes, inter alia, digital data.

After generation of the syndromes (i.e., $S_0$ and $S_1$ over the "Q" portion of the pack; syndromes $S_0$ and $S_1$ over the "P" portion of the pack; and syndromes $S_2$ and $S_3$ over the entire pack), system controller 10 analyzes the syndromes (see step 1520). The analysis of step 1520 develops four potential cases and applies a different correction strategy to three of the cases. According to a first case, errors occur in the P portion of the pack but not in the Q portion of the pack, thereby prompting system controller 10 to execute a double error detection strategy [DED] (illustrated by step 1530 in FIG. 15). According to a second case, errors occur in both the P and Q portions of the pack, thereby prompting system controller 10 to execute a single error detection strategy [SED] (illustrated by step 1540 in FIG. 15) over both portions of the pack and thereafter to regenerate syndromes over the corrected codeword (illustrated by step 1541 in FIG. 15). According to a third case, errors occur in the Q portion of the pack but not in the P portion of the pack, thereby prompting system controller 10 to execute a quadruple error detection strategy [QD] (illustrated by step 1550 in FIG. 15). According to a fourth case, all syndromes are zero (indicating that no errors exist in the pack).

OPERATION

SYNDROME GENERATION (AUDIO WITH SUBCODES)

As indicated in FIG. 15, syndrome generation for subcodes involves two separate stages of generation (depicted by step 1510A and 1510B). During step 1510A, the first four bytes (the "Q" portion of the pack) are utilized for generating syndromes $S_0$, $S_1$ over the Q portion and for beginning generation of syndromes $S_2$, $S_3$ over the entire pack. During step 1510B, the remaining bytes of the pack (e.g., the "P" portion of the pack) are utilized for finishing generation of $S_2$, $S_3$ over the entire pack and for generating syndromes $S_0$, $S_1$ over the "P" portion of the pack.

During subcode syndrome generation, each byte of the subcode pack (see FIG. 8A) is clocked into generator 20 twice—once for generating subcode syndromes $S_0$, $S_1$ and once for generating syndromes $S_2$, $S_3$. Thus, when generating syndromes for subcodes, registers 206, 208 are not used for different interleaves as in generation of syndromes for computer data, but rather for different syndromes for subcodes.

TABLE 1 describes the shifting of registers 206, 208 and the operation of feedback multiplication for the generation of subcode syndromes.

TABLE 1

| Reg 206 (0) | Reg 208 (0) | Reg 206 (1) | Reg 208 (1) |
| --- | --- | --- | --- |
| $S_0$ | $S_2$ | $S_1$ | $S_3$ |
| $S_2$ | $S_0$ | $S_3\alpha$ | $S_1$ |
| $S_0$ | $S_2$ | $S_1$ | $S_3\alpha$ |
| $S_2\alpha$ | $S_0$ | $S_3\alpha^2$ | $S_1$ |
| $S_0 + D$ | $S_2\alpha$ | $S_1\alpha + D$ | $S_3\alpha^2$ |
| $S_2\alpha^2 + D$ | $S_0 + D$ | $S_3\alpha^3 + D$ | $S_1\alpha + D$ |
| $S_0 + D$ | $S_2\alpha^2 + D$ | $S_1\alpha + D$ | $S_3\alpha^3 + D$ |

The first row of TABLE 1 shows how the first data byte is loaded into the registers, with the first data byte in the respective registers being labeled as $S_0$, $S_1$, $S_2$, and $S_3$ to refer to the syndromes which will be generated therefrom. Following the first row of TABLE 1, six steps are executed corresponding to the next six rows of TABLE 1. The fifth and six rows of TABLE 1 show adding of a second data byte in two clock cycles—first to syndromes $S_0$ and $S_1$ in row five and then (after shifting of register values) to syndromes $S_2$ and $S_3$ in row six. Row seven shows a further shifting of syndromes in preparation for the unillustrated addition of a further data byte. Prior to addition of a further data byte, it will be understood that the expressions in row seven of TABLE 1 become the updated values for the respective syndromes (e.g., $S_1\alpha+D$) will become $S_1$ prior to the addition of a next data byte.

After row seven of TABLE 1, further data bytes are added in like manner as illustrated with respect to TABLE 1. That is, for each subcode data byte, the six steps reflected by rows two through seven of TABLE 1 are executed, with only two of the six clocks actually being involved in the introduction of a new data byte.

With respect to the six steps of TABLE 1, it will be noticed that the contents of register 206 is always shifted into register 208. Register 206 is always fed with the contents of register 208 times either "1" or "$\alpha$". Whether multiplication occurs by "1" or "$\alpha$" is based on the setting of MUXes 230, 240 (see FIG. 2A).

After the six steps of TABLE 1 are executed four times (i.e., after the first four data bytes have been added in generator 20), register 208(0) contains subcode syndrome $S_0$ generated over the Q portion of the pack and register 208(1) contains subcode syndrome $S_1$ computed over the Q portion of the pack. At this point, the subcode syndromes $S_0$, $S_1$ over the Q portion of the pack are loaded into the calculation section 30, thereby completing step 1510A of FIG. 15.

After the off-loading of syndrome $S_0$, $S_1$ over the Q portion of the pack, the contents of the registers 206, 208 are again switched (i.e., as in the last row of TABLE 1) and the six steps are repeated for the fifth and remaining bytes of the pack. However, in order to generate syndrome $S_0$, $S_1$ over the P portion of the pack, the register containing the syndromes $S_0$, $S_1$ over the Q portion of the pack are cleared, so that the fifth byte of the pack can be loaded therein.

Thus, after all twenty four bytes of the subcode pack have been entered into generator 20, and the steps of TABLE 1 executed for each byte, registers 208(0) and 208(1) will ultimately contain subcode syndromes $S_0$, $S_1$, respectively, generated over the Q portion of the pack and registers 206(0), 206(1) will ultimately contain subcode syndromes $S_2$, $S_3$, respectively, generated over the entire pack, thereby completing step 1510B of FIG. 15.

OPERATION

DOUBLE ERROR DETECTION (AUDIO WITH SUBCODES)

FIG. 15A shows substeps executed at step 1530 of FIG. 15 (i.e., when evaluation of the subcode syndromes indicates that errors reside only in the P portion of the subcode pack and not in the Q portion of the subcode pack). FIG. 15A thus shows substeps included in the Double Error Detection (DED) procedure of the invention for subcodes.

At substep 1530-2, the error locator polynomial is generated in a form usable by calculation section 30 for the root search of substep 1530-4. In general, the error locator polynomial is for the form of SUBCODE EQUATION 1:

$$1 + \frac{\sigma'_1}{\Delta} \alpha^k + \frac{\sigma'_2}{\Delta} \alpha^{2k} = 0$$

But since a root search is normally conducted backwards, SUBCODE EQUATION 1 must be multiplied by $\alpha^{-n}$ (where n is 19) and can conveniently be multiplied by $\Delta$ in order to yield the root search-utilizable SUBCODE EQUATION 2:

$$\Delta + \alpha^{-n}\sigma'_1\alpha^{-k} + \alpha^{-2n}\sigma'_2\alpha^{-2k} = 0$$

The error locator polynomial of SUBCODE EQUATION 2 is generated in the manner shown with respect to substeps 1530-2-2 through 1530-2-8 in FIG. 15A. The error locator polynomial of SUBCODE EQUATION 2 is generated using the syndromes $S_0$(over P), $S_1$ (over P), $S_2$, and $S_3$ which were generated at steps 1510A, 1510B of FIG. 15. First, at substep 1530-2-2, the term $\sigma_2'\alpha^{-n}$ is generated using SUBCODE EQUATION 3:

$$\sigma_2\alpha^{-n} = S_1S_3\alpha^{+n} - S_2{}^2\alpha^{-n}$$

Then, at substep 1530-2-4, the term $\sigma_2\alpha^{-2n}$ is generated by multiplying the value obtained for SUBCODE EQN 3 by $\alpha^{-n}$. At substep 1530-2-6, the term $\sigma_1\alpha^{-n}$ is obtained using SUBCODE EQUATION 4:

$$\sigma_1\alpha^{-n} = S_0S_3\alpha^{-n} + S_1S_2\alpha^{-n}$$

Finally, at step 1530-2-8, the term $\Delta$ is obtained using SUBCODE EQUATION 5:

$$\Delta = S_0S_2 + S_1{}^2$$

At step 1530-4, calculation section 30 conducts a root search by loading the value of $\sigma_2\alpha^{-2n}$ into register 400, loading the value of $\Delta$ into register 300(1), loading the value of $\sigma_1\alpha^{-n}$ into register 402, and summing the contents of the three registers using the summation circuit of FIG. 3A. For each root search iteration, register 400 is clocked twice with feedback (for the $\alpha^{-2n}$ term) and register 402 is clocked once with feedback (for the $\alpha^{-n}$ term).

When a root is located, an error locator byte of the form $\alpha^L$ must be generated by generation section 20. In this regard, when a root is located, bit 0 of GDAT is set (as indicated by substep 1530-6). The generation of error locator bytes by generation section 20 is understood by reference to the analogous generation of error pointer bytes of the form $\alpha^L$ as occurs with computer data with pointers (already described above).

Determinations are made at substeps 1530-8 and 1530-12 with respect to the number and location of roots detected during the convolution of substep 1530-4. These determinations govern what type of correction (if any) is to occur with respect to the errors having the detected roots.

For example, if it is determined at substep 1530-8 that roots were detected in three of the first three locations, then at substep 1530-10 the calculation section 30 performs a single error correction procedure. The single error correction procedure performed at substep 1530-10 is essentially the same as that employed for computer data with pointers as discussed above (see, e.g., the foregoing discussions entitled OPERATION: POINTER PROCESSING [case 1] and OPERATION: ERROR PATTERN GENERATION [case 1]). In the pointer processing and error pattern generation of substep 1530-10, the subcode syndromes $S_0$, $S_1$ (both over the P portion of the pack) are utilized. As a result of error pattern generation, correction section 60 uses the error pointer and the error pattern to correct the single erroneous byte in the P portion of the subcode pack.

If it is determined at substep 1530-12 that there are less than two roots in the subcode pack, the pack is determined to be uncorrectable.

When two roots are determined to exist with respect to the subcode pack, calculation section 30 conducts a double erasure correction procedure (depicted by substep 1530-14) in order to correct the two errors. The double erasure correction procedure performed at substep 1530-14 is essentially the same as that employed for computer data with pointers as discussed above (see, e.g., the foregoing discussions entitled OPERATION: POINTER PROCESSING [case 2] and OPERATION: ERROR PATTERN GENERATION [case 2]). In the pointer processing and error pattern generation of substep 1530-14, the subcode syndromes $S_0$, $S_1$ (both over the P portion of the pack) are utilized. As a result of error pattern generation, correction section 60 uses the error pointers and the error patterns to correct the two erroneous bytes in the P portion of the subcode pack.

Although the steps of calculation are not specifically described herein, it should be understood that calculation section 60 performs the evaluations of $\sigma_2\alpha^{-2n}$, $\Delta$, and $\sigma_1\alpha^{-n}$ which are used for the root search of substep 1530-4.

OPERATION

SINGLE ERROR DETECTION (AUDIO WITH SUBCODES)

When it is determined at step 1520 of FIG. 15 that errors exist in both the Q portion and the P portion of the subcode pack (see FIG. 8A), a single error detection operation is separately conducted (step 1540) with respect to both portions of the subcode pack.

The single error detection (SED) operation of step 1540 is shown in more detail in FIG. 15B. As a first substep (substep 1540-2), error detection/correction is performed with respect to the Q section of the pack. At substep 1540-2, the subcode syndrome values $S_0$, $S_1$ generated over the Q portion of the pack are utilized to conduct the same error pointer processing and error pattern generations as described in connection with case 1 of computer data. In this regard, see, e.g., the foregoing discussions entitled OPERATION: POINTER PROCESSING [case 1] and OPERATION: ERROR PATTERN GENERATION [case 1]). In connection with substep 1540-2, correction section 60 uses the error pointer and error pattern so generated to correct the erroneous byte in the Q portion of the subcode pack.

Secondly, at substep 1540-4, error detection/correction is performed with respect to the P section of the pack. At substep 1540-4, the subcode syndrome values $S_0$, $S_1$ generated over the Q portion of the pack are utilized to conduct the same error pointer processing and error pattern generations as described in connection with case 1 of computer data. In this regard, again see, e.g., the foregoing discussions entitled OPERATION: POINTER PROCESSING [case 1] and OPERATION: ERROR PATTERN GENERATION [case 1]). In connection with substep 1540-2, correction section 60 uses the error pointer and error pattern so generated to correct the erroneous byte in the P portion of the subcode pack.

As indicated in step 1541 of FIG. 15, after attempted correction of the Q and P portions of the subcode pack at substeps 1540-2 and 1540-4, respectively, all subcodes syndromes are again regenerated in the same manner as above described (see, e.g., OPERATION: SYNDROME GENERATION (AUDIO WITH SUBCODES). If all regenerated syndromes are zero, the subcode pack is deemed correctable.

OPERATION

QUADRUPLE ERASURE CORRECTION (AUDIO WITH SUBCODES)

When it is determined at step 1520 of FIG. 15 that errors exist only in the Q portion of the subcode pack (see FIG. 8A), e.g., $S_0$ and $S_1$ over the P portion of the pack are zero, the quadruple erasure correction of step 1550 is conducted with respect to the Q portion of the subcode pack.

At substep 1550-2, four error patterns $E_0$, $E_1$, $E_2$ and $E_3$ are calculated at substep 1550-4. Each error pattern is generated using the following equation:

$$E_k = S_0 a_{k0} + S_1 a_{k1} + S_2 a_{k2} + S_3 a_{k3}$$

wherein log values for $a_{k0}$, $a_{k1}$, $a_{k2}$, and $a_{k3}$ are selected in accordance with TABLE 2.

TABLE 2

| $E_k$ | $a_{k0}$ | $a_{k1}$ | $a_{k2}$ | $a_{k3}$ |
|---|---|---|---|---|
| $E_0$ | 13 | 37 | 59 | 13 |
| $E_1$ | 40 | 22 | 31 | 39 |
| $E_2$ | 42 | 11 | 45 | 40 |
| $E_3$ | 19 | 42 | 0 | 16 |

After computation of the four error patterns E0, $E_1$, $E_2$ and $E_3$ at substep 1550-2, a check is made (at substep 1550-4) to ensure that at least one of the error patterns is zero. This is to reduce the probability of miscorrection. If none of the error patterns is zero, then the subcode pack is deemed uncorrectable. The error patterns are used by the correction section 60 in order to correct the three or less erroneous bytes in the Q portion of the subcode pack.

While the invention has been particularly shown and described with reference to the preferred embodiments thereof, it will be understood by those skilled in the art that various alterations in form and detail may be made therein without departing from the spirit and scope of the invention.

The embodiments of the invention in which an exclusive property or privilege is claimed are defined as follows:

1. Error correction apparatus for use with a buffer obtaining data in the form of codewords and any pointers generated with respect to such data, the pointers from the buffer being one bit buffer-obtained pointers, the error correction apparatus comprising:

a generator which generates syndromes for the codewords and which uses any one bit buffer-obtained pointer for the codeword to generate a multi-bit buffer-obtained pointer;

a calculation unit which uses the syndromes generated by the generator for a codeword to generate an error pattern for the codeword;

a correction unit which uses the error pattern generated by the calculation unit to correct the codeword for which the error pattern was generated.

2. The apparatus of claim 1, wherein the buffer obtains data in the form of codewords from a compact disk.

3. The apparatus of claim 1, wherein, when two one bit buffer-obtained pointers are provided in the buffer for a codeword, the generator generates two corresponding multi-bit buffer-obtained pointers, and wherein the calculation unit also uses the two multi-bit buffer-obtained pointers for a codeword to form an intermediate pointer expression with respect to the codeword, and wherein the calculation unit uses both the syndromes generated by the generator for a codeword and the intermediate pointer expression to generate two error patterns for the codeword.

4. The apparatus of claim 1, wherein, when one one bit buffer-obtained pointer is provided in the buffer for a codeword, the calculation unit uses the syndromes generated by the generator to generate an independently-derived pointer for the codeword.

5. The apparatus of claim 4, wherein the calculation unit uses a syndrome generated by the generator as a sole error pattern for the codeword.

6. The apparatus of claim 4, wherein the calculation unit compares the independently-derived pointer for the codeword with the multi-bit buffer-obtained pointer for the codeword and outputs a pointer comparison signal in accordance with the comparison.

7. The apparatus of claim 6, wherein the pointer comparison signal indicates an uncorrectable codeword if the independently-derived pointer for the codeword does not equal the multi-bit buffer-obtained pointer for the codeword.

8. The apparatus of claim 1, wherein the multi-bit buffer-obtained pointer generated by the generator is of the format $\alpha^L$.

9. The apparatus of claim 1, wherein the generator and the calculation unit are each operated during two phases, wherein during a first phase:

the generator uses any one bit buffer-obtained pointer for a most-recent codeword to generate a multi-bit buffer-obtained pointer for the most-recent codeword; while the calculation unit uses the syndromes generated by the generator for a previous codeword to generate an error pattern for the previous codeword; and wherein during a second phase:

the generator generates syndromes for the most-recent codeword; while the calculation unit performs a mathematical operation with respect to any multi-bit buffer-obtained pointers for the most-recent codeword.

10. The apparatus of claim 9, wherein, when one one bit buffer-obtained pointer is provided in the buffer for a codeword, the mathematical operation performed with respect to the multi-bit buffer-obtained pointer is conversion of the multi-bit buffer-obtained pointer from an $\alpha$ basis representation to a $\beta$ basis representation.

11. The apparatus of claim 9, wherein during the second phase the calculation unit uses the syndromes generated by the generator to generate an independently-derived pointer for the codeword.

12. The apparatus of claim 11, wherein during the first phase the calculation unit compares the independently-derived pointer for the previous codeword with the multi-bit buffer-obtained pointer for the previous codeword and outputs a pointer comparison signal in accordance with the comparison.

13. The apparatus of claim 12, wherein the pointer comparison signal indicates an uncorrectable codeword if the independently-derived pointer for the previous codeword does not equal the multi-bit buffer-obtained pointer for the previous codeword.

14. The apparatus of claim 9, wherein, when two one bit buffer-obtained pointers are provided in the buffer for a codeword, the mathematical operation performed with respect to the multi-bit buffer-obtained pointer is conversion of the two multi-bit buffer-obtained pointers from an $\alpha$ basis representation to a $\beta$ basis representation and forming an inverse of the sum of the $\beta$ basis representation of the two multi-bit buffer-obtained pointers.

15. The apparatus of claim 9, wherein the correction unit also is operated during two phases, wherein during the first phase the correction unit stores any multi-bit buffer-obtained pointers for the most recent codeword and during the second phase the correction unit uses the error pattern generated by the calculation unit to correct the previous codeword.

16. The apparatus of claim 9, wherein the buffer is conceptualized as having two interleaved blocks, including a first block and a second block, wherein codewords are obtained from the buffer in pairs, each pair of codewords including a first-block most-recent codeword obtained from the first block and a second-block most-recent codeword obtained from the second block, and wherein during the first phase:
the generator generates any multi-bit buffer-obtained pointers for both the first-block most-recent codeword and the second-block most-recent codeword; while
the calculation unit generates an error pattern for a previous codeword from the first block and then generates an error pattern for a previous codeword from the second block, the previous codeword from the first block having been paired with the previous codeword from the second block; and wherein during a second phase:
the generator generates syndromes for the first-block most-recent codeword and the second-block most-recent codeword; while
the calculation unit performs a mathematical operation with respect to any multi-bit buffer-obtained pointers for the previous codeword from the first block and the previous codeword from the second block.

17. An error correction method for use with a buffer obtaining data in the form of codewords and any pointers generated with respect to such data, the pointers from the buffer being one bit buffer-obtained pointers, the error correction method comprising the steps of:

(1) using any one bit buffer-obtained pointer for a most-recent codeword to generate a multi-bit buffer-obtained pointer for the most-recent codeword; while (2) using syndromes generated for a previous codeword to generate an error pattern for the previous codeword;

(3) generating syndromes for the most-recent codeword; while (4) performing a mathematical operation with respect to any multi-bit buffer-obtained pointers for the most-recent codeword.

18. The method of claim 17, wherein the buffer obtains data in the form of codewords from a compact disk.

19. The method of claim 17, further comprising the step of using a syndrome generator both to generate the syndromes and to generate a multi-bit buffer-obtained pointer.

20. The method of claim 17, wherein steps (1) and (2) are executed essentially concurrently during a first phase of operation while steps (3) and (4) are executed essentially concurrently during a second phase of operation.

21. The method of claim 17, wherein during steps (1) and (2) any multi-bit buffer-obtained pointers for the most recent codeword is stored in a correction unit, and wherein during steps (3) and (4) the second phase the correction unit uses the error pattern generated by the calculation unit to correct the previous codeword.

22. The method of claim 17, wherein, when two one bit buffer-obtained pointers are provided in the buffer for a two-errored codeword, two corresponding multi-bit buffer-obtained pointers are generated for the two-errored codeword during step (1), wherein in step (4) the two multi-bit buffer-obtained pointers for the two-errored codeword are used to form an intermediate pointer expression with respect to the two-errored codeword, and wherein in step (2) both the syndromes and the intermediate pointer expression are used to generate two error patterns for the two-errored codeword.

23. The method of claim 17, wherein, when one one bit buffer-obtained pointer is provided in the buffer for a less-than-two-errored codeword, the syndromes are used to generate an independently-derived pointer for the less-than-two-errored codeword.

24. The method of claim 23, wherein the independently-derived pointer is generated during step (2).

25. The method of claim 23, further comprising:

comparing the independently-derived pointer for the less-than-two-errored codeword with the multi-bit buffer-obtained pointer for the less-than-two-errored codeword; and outputting a pointer comparison signal in accordance with the comparison.

26. The method of claim 25, wherein the pointer comparison signal indicates an uncorrectable codeword if the independently-derived pointer for the less-than-two-errored codeword does not equal the multi-bit buffer-obtained pointer for the less-than-two-errored codeword.

27. The method of claim 23, wherein a syndrome is used as a sole error pattern for the codeword.

28. The method of claim 17, wherein, when one one bit buffer-obtained pointer is provided in the buffer for a less-than-two-errored codeword, the mathematical operation performed with respect to the multi-bit buffer-obtained pointer is conversion of the multi-bit buffer-obtained pointer from an $\alpha$ basis representation to a$\beta$ basis representation.

29. The method of claim 17, wherein, when two one bit buffer-obtained pointers are provided in the buffer for a two-errored codeword, the mathematical operation performed with respect to the multi-bit buffer-obtained pointer comprises:

conversion of the two multi-bit buffer-obtained pointers from an $\alpha$ basis representation to a $\beta$ basis representation; and forming an inverse of the sum of the $\beta$ basis representation of the two multi-bit buffer-obtained pointers.

30. The method of claim 17, wherein the buffer is conceptualized as having two interleaved blocks, including a first block and a second block, wherein codewords are obtained from the buffer in pairs, each pair of codewords including a first-block most-recent codeword obtained from the first block and a second-block most-recent codeword obtained from the second block, and wherein during step (1) any multi-bit buffer-obtained pointers are generated for both the first-block most-recent codeword and the second-block most-recent codeword;

wherein during step (2) an error pattern is first generated for a previous codeword from the first block and then an error pattern is generated for a previous codeword from the second block, the previous codeword from the first block having been paired with the previous codeword from the second block;

wherein during step (3) syndromes are generated for the first-block most-recent codeword and the second-block most-recent codeword; and wherein during step (4) mathematical operations are preformed with respect to any multi-bit buffer-obtained pointers for the previous codeword from the first block and the previous codeword from the second block.

31. The method of claim 30, wherein steps (1) and (2) are executed essentially concurrently during a first phase of operation while steps (3) and (4) are executed essentially concurrently during a second phase of operation.

32. The method of claim 30, wherein, when two one bit buffer-obtained pointers are provided in the buffer for a two-errored codeword, two corresponding multi-bit buffer-obtained pointers are generated for the two-errored codeword during step (1), wherein in step (4) the two multi-bit buffer-obtained pointers for the two-errored codeword are used to form an intermediate pointer expression with respect to the two-errored codeword, and wherein in step (2) both the syndromes and the intermediate pointer expression are used to generate two error patterns for the two-errored codeword.

33. The method of claim 30, wherein, when one one bit buffer-obtained pointer is provided in the buffer for a less-than-two-errored codeword, the syndromes are used to generate an independently-derived pointer for the less-than-two-errored codeword.

34. The method of claim 33, wherein the independently-derived pointer is generated during step (2).

35. The method of claim 34, further comprising:
comparing the independently-derived pointer for the less-than-two-errored codeword with the multi-bit buffer-obtained pointer for the less-than-two-errored codeword; and
outputting a pointer comparison signal in accordance with the comparison.

36. The method of claim 35, wherein the pointer comparison signal indicates an uncorrectable codeword if the independently-derived pointer for the less-than-two-errored codeword does not equal the multi-bit buffer-obtained pointer for the less-than-two-errored codeword.

37. The method of claim 30, wherein, when one one bit buffer-obtained pointer is provided in the buffer for a less-than-two-errored codeword, the mathematical operation performed with respect to the multi-bit buffer-obtained pointer is conversion of the multi-bit buffer-obtained pointer from an $\alpha$ basis representation to a $\beta$ basis representation.

38. The method of claim 30, wherein, when two one bit buffer-obtained pointers are provided in the buffer for a two-errored codeword, the mathematical operation performed with respect to the multi-bit buffer-obtained pointer comprises:
conversion of the two multi-bit buffer-obtained pointers from an $\alpha$ basis representation to a $\beta$ basis representation; and
forming an inverse of the sum of the $\beta$ basis representation of the two multi-bit buffer-obtained pointers.

39. The method of claim 30, wherein the buffer obtains data in the form of codewords from a compact disk.

40. A computer implemented method of performing error correction with respect to a subcode pack, the method comprising:
generating a first set of syndromes over a first portion of the pack;
generating a second set of syndromes over a second portion of the pack;
generating a third set of syndromes over the entire pack;
analyzing the first, second, and third set of syndromes; and
selecting one of a plurality of error correction strategies for the pack in accordance with the analysis.

41. The method of claim 40, wherein the first set of syndromes is generated over a Q portion of the pack and wherein the second set of syndromes is generated over a P portion of the pack.

42. The method of claim 40, wherein the first set of syndromes is generated over a portion of the pack containing pack-identifying information and the second set of syndromes is generated over a portion of the pack containing digital data.

43. The method of claim 40, wherein a first strategy is selected when the analysis indicates that errors may be present in the second portion of the pack but not in the first portion of the pack.

44. The method of claim 43, wherein the first strategy involves a double error correction of the second portion of the pack.

45. The method of claim 44, wherein the double error correction of the second portion of the pack involves:
conducting a root search with an error locator polynomial;
using root(s) located during the root search to generate pointers;
using the syndromes to generate error patterns for bytes in the second portion of the pack indicated by the pointers.

46. The method of claim 40, wherein a second strategy is selected when the analysis indicates that errors may be present in both the first portion of the pack and the second portion of the pack.

47. The method of claim 46, wherein the second strategy involves a single error correction in each of the first portion of the pack and the second portion of the pack.

48. The method of claim 47, wherein the second strategy involves using the syndromes generated over only the first portion of the pack to generate an error pattern for a byte in the first portion of the pack and using the syndromes generated over only the second portion of the pack to generate an error pattern for a byte in the second portion of the pack.

49. The method of claim 40, wherein a third strategy is selected when the analysis indicates that errors may be present only in the first portion of the pack.

50. The method of claim 49, wherein the third strategy involves a correction of three bytes in the first portion of the pack.

51. The method of claim 49, wherein a plurality of error patterns are computed using a linear combination of the syndromes.

52. A calculator which receives single bit input values and which uses the single bit values to generate multi-bit output values for use in error correction of data, the calculator comprising:
a multi-bit register which serially receives the single bit input values;
a feedback circuit connected to receive as input to the feedback circuit a selected one of at least two sets of bit(s) of the register, the selection one of the two sets of bit(s) being in accordance with a selected field generator polynomial, the feedback circuit serving perform a multiplication with respect to the input received from the register and to apply a product of the multiplication to the register, whereby the calculator is selectively configurable to generate multi-bit values having different field lengths.

53. The apparatus of claim 52, wherein the calculator performs a basis conversion for a pointer.

54. The apparatus of claim 52, wherein the calculator performs a basis conversion for a pointer both for computer data and for digital audio subcodes.

55. The apparatus of claim 52, wherein the calculator generates both eight bit output values and six bit output values.

56. The apparatus of claim 52, wherein a first field is a finite field GF(2^m) and a second field is a finite field GF(2^n) where m does not equal n.

57. The apparatus of claim 52, wherein the multi-bit register is a first serial register, and further comprising:
a second serial register;
an inner product circuit which generates a serial inner product value with respect to contents of the first serial register and contents of the second serial register;
an adder which updates the contents of the second serial register using the serial inner product.

58. The apparatus of claim 52, wherein the feedback circuit comprises:
a first XOR gate connected to a first of the at least two sets of bit(s) of the register;
a second XOR gate connected to a second of the at least two sets of bit(s) of the register;
an enable gate connected to an output terminal of the second XOR gate and to a field length selection signal; and
a third XOR gate connected to an output terminal of the first XOR gate and to an output terminal of the enable gate, and output terminal of the third XOR gate being connected to the register.

59. A generator for generating output values for use in error correction, the generator comprising:
a first adder having a first input terminal connected to receive input values;
a first register pair for accumulating output values therein, a first register of the first register pair having:
an input terminal connected to an output terminal of the first adder; and
an output terminal connected to an input terminal of a second register of the first register pair;
a first feedback circuit, the first feedback circuit having an input terminal connected to an output terminal of the second register of the first register pair and an output terminal connected to a second input terminal of the first adder; and
wherein the first feedback circuit is selectively configurable so that a selected one of a plurality of feedback constants is utilized thereby.

60. The apparatus of claim 59, wherein the first feedback circuit is configurable to select between feedback constants for differing field lengths.

61. The apparatus of claim 60, wherein the first feedback circuit has a plurality of feedback lines with a plurality of corresponding feedback constant multipliers thereon, and wherein the first feedback circuit further comprises a switch for selecting between the plurality of feedback lines.

62. The apparatus of claim 60, wherein a first feedback constant is for an eight-bit byte field length and a second feedback constant is for a six-bit byte field length.

63. The apparatus of claim 62, wherein the generator is a syndrome generator, and wherein the generator generates syndromes for computer data by using the first feedback constant and wherein the generator generates syndromes for subcodes by using the second feedback constant.

64. The apparatus of claim 59, further comprising:
a second adder having a first input terminal connected to receive input values;
a second register pair for accumulating output values therein, a first register of the second register pair having:
an input terminal connected to an output terminal of the second adder; and
an output terminal connected to an input terminal of a second register of the second register pair;
a second feedback circuit, the second feedback circuit having an input terminal connected to an output terminal of the second register of the second register pair and an output terminal connected to a second input terminal of the second adder; and
wherein the second circuit is selectively configurable so that a selected one of a plurality of feedback constants is utilized thereby.

65. The apparatus of claim 64, further comprising switching means for applying a same input value to the first adder and to the second adder.

66. An error correction system for a compact disk drive which is operable to correct either computer data or subcodes stored in a buffer, the error correction system comprising:
a controller which outputs a mode signal indicative of whether computer data or digital audio subcodes is being corrected;
a syndrome generator which generates one of computer data syndromes and subcode syndromes in accordance with the signal outputted by the controller;
an error pattern generator which, under control of the controller, uses syndromes generated by the syndrome generator to generate error patterns;
wherein, in accordance with the mode signal and the syndromes generated by the syndrome generator, the controller selects from a plurality of error pattern generation procedures for controlling error pattern generation by the error pattern generator.

67. The apparatus of claim 66, wherein when the mode signal indicates that computer data is being corrected, the error pattern generator also uses the syndromes to generate system pointer bits, and wherein the syndrome generates multi-bit system pointer values using the system pointer bits.

68. The apparatus of claim 67, wherein the error pattern generator further compares the multi-bit system pointer values with buffer-supplied pointer values.

69. The apparatus of claim 66, wherein when the mode signal indicates that computer data is being corrected, the controller selects an error pattern generation procedure in accordance with a number of buffer-supplied pointers stored in the buffer with respect to the data being corrected.

70. The apparatus of claim 69, wherein when the mode signal indicates that computer data is being corrected and there is only one buffer-supplied pointer, the error pattern generator uses the syndromes to generate system pointers.

71. The apparatus of claim 66, wherein when the mode signal indicates that subcode data is being corrected, the syndrome generator generates a first set of syndromes over a first portion of a subcode pack, a second set of syndromes over a second portion of the pack, and a third set of syndromes over the entire pack.

72. The apparatus of claim 71, wherein the first set of syndromes is generated over a portion of the pack containing pack-identifying information and the second set of syndromes is generated over a portion of the pack containing digital data.

73. The apparatus of claim 71, wherein when the mode signal indicates that subcode data is being corrected, the controller selects a first subcode error pattern generation strategy when the syndromes indicate that errors may be present in the second portion of the pack but not in the first portion of the pack; a second error pattern generation strategy when the syndromes indicate that errors may be present in both the first portion of the pack and the second portion of the pack; and a third error pattern generation strategy when the syndromes indicate that errors may be present only in the first portion of the pack.

* * * * *